United States Patent
Sakamoto

(10) Patent No.: US 10,396,091 B2
(45) Date of Patent: Aug. 27, 2019

(54) SEMICONDUCTOR MEMORY DEVICE

(71) Applicant: Toshiba Memory Corporation, Minato-ku (JP)

(72) Inventor: Kei Sakamoto, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/262,303

(22) Filed: Sep. 12, 2016

(65) Prior Publication Data
US 2017/0271359 A1 Sep. 21, 2017

Related U.S. Application Data

(60) Provisional application No. 62/309,507, filed on Mar. 17, 2016.

(51) Int. Cl.
*H01L 27/1157* (2017.01)
*H01L 27/11565* (2017.01)
*H01L 27/11582* (2017.01)

(52) U.S. Cl.
CPC .... *H01L 27/11582* (2013.01); *H01L 27/1157* (2013.01); *H01L 27/11565* (2013.01)

(58) Field of Classification Search
CPC ............ H01L 27/11517; H01L 29/788; H01L 29/42324; H01L 29/66825; H01L 29/792; H01L 2924/13081; H01L 2924/13085; H01L 257/314; H01L 21/76877–76883; H01L 21/768; H01L 21/76802–76817; G11C 5/06–10
See application file for complete search history.

(56) References Cited

U.S. PATENT DOCUMENTS

| | | | |
|---|---|---|---|
| 5,869,393 A * | 2/1999 | Tseng | H01L 21/76802 257/E21.577 |
| 8,963,230 B2 | 2/2015 | Imamura et al. | |
| 2006/0275982 A1 | 12/2006 | Fukuzaki et al. | |
| 2008/0079161 A1 | 4/2008 | Kim | |
| 2010/0052030 A1 | 3/2010 | Sakaguchi et al. | |
| 2010/0213526 A1* | 8/2010 | Wada | H01L 21/76808 257/314 |
| 2016/0064406 A1* | 3/2016 | Natori | H01L 27/11582 257/43 |

* cited by examiner

*Primary Examiner* — Moazzam Hossain
*Assistant Examiner* — Stanetta D Isaac
(74) *Attorney, Agent, or Firm* — Oblon, McClelland, Maier & Neustadt, L.L.P.

(57) ABSTRACT

According to an embodiment, a semiconductor memory device comprises control gate electrodes, a first semiconductor layer, a gate insulating layer, a first contact, a second semiconductor layer, a second contact, and a first conductive layer. The control gate electrodes are stacked above a substrate. The first semiconductor layer faces the control gate electrodes. The gate insulating layer is provided between the control gate electrode and the first semiconductor layer. The first contact is connected to an upper end of the first semiconductor layer. The second contact is connected to a lower end of the first semiconductor layer via the second semiconductor layer. The first conductive layer is provided above the second contact. Moreover, an end of the first conductive layer closest to the first contact is closer to the first contact than an end of the second contact closest to the first contact.

16 Claims, 23 Drawing Sheets

SEMICONDUCTOR MEMORY DEVICE

CROSS-REFERENCE TO RELATED APPLICATIONS

This application is based upon and claims the benefit of U.S. Provisional Patent Application No. 62/309,507, filed on Mar. 17, 2016, the entire contents of which are incorporated herein by reference.

FIELD

Embodiments described herein relate to a semiconductor memory device.

BACKGROUND

Description of the Related Art

A flash memory that stores data by accumulating a charge in a charge accumulation layer, is known. Such a flash memory is connected by a variety of systems such as NAND type or NOR type, and configures a semiconductor memory device. In recent years, a semiconductor memory device in which memory cells are disposed three-dimensionally (three-dimensional type semiconductor memory device) has been proposed to raise integration level.

DETAILED DESCRIPTION

A semiconductor memory device according to an embodiment comprises a plurality of control gate electrodes, a first semiconductor layer, agate insulating layer, a first contact, a second semiconductor layer, a second contact, and a first conductive layer. The plurality of control gate electrodes are stacked in a first direction above a substrate. The first semiconductor layer extends in the first direction and faces the plurality of control gate electrodes. The gate insulating layer is provided between the control gate electrode and the first semiconductor layer. The first contact is connected to an upper end of the first semiconductor layer. The second semiconductor layer is connected to a lower end of the first semiconductor layer and extends in a second direction intersecting the first direction. The second contact is connected to the second semiconductor layer at its lower end. Moreover, the second contact extends in the first direction. The first conductive layer is provided above the second contact. Moreover, an end of the first conductive layer closest to the first contact is positioned on a closer side to the first contact than an end of the second contact closest to the first contact.

Next, nonvolatile semiconductor memory devices according to embodiments will be described in detail with reference to the drawings. Note that these embodiments are merely examples, and are not shown with the intention of limiting the present invention.

For example, the nonvolatile semiconductor memory devices described below have a memory string comprising a plurality of memory cells (memory transistors) arranged in a first direction intersecting an upper surface of a substrate. These memory cells include: a first semiconductor layer extending in the above-described first direction and functioning as a channel body; and a control gate electrode provided on a side surface of the first semiconductor layer via a gate insulating layer.

These plurality of memory cells configure the memory string. One memory string may include one first semiconductor layer, or may include two or more first semiconductor layers joined at one ends (lower ends) thereof.

In addition, the above-described memory cell may be a MONOS (Metal-Oxide-Nitride-Oxide-Semiconductor) type memory cell that includes a charge accumulation layer configured from a nitride and a control gate electrode made of a metal, or may be a SONOS (Semiconductor-Oxide-Nitride-Oxide-Semiconductor) type memory cell that includes a control gate electrode made of a semiconductor.

Moreover, the above-described gate insulating layer may include a floating gate, not a charge accumulation layer configured from a nitride. As a floating gate type memory cell, refer to U.S. patent application Ser. No. 13/112,345 whose disclosure content is herewith incorporated by this reference.

[Semiconductor Memory Device According to First Embodiment]

[Configuration]

Figure 1:
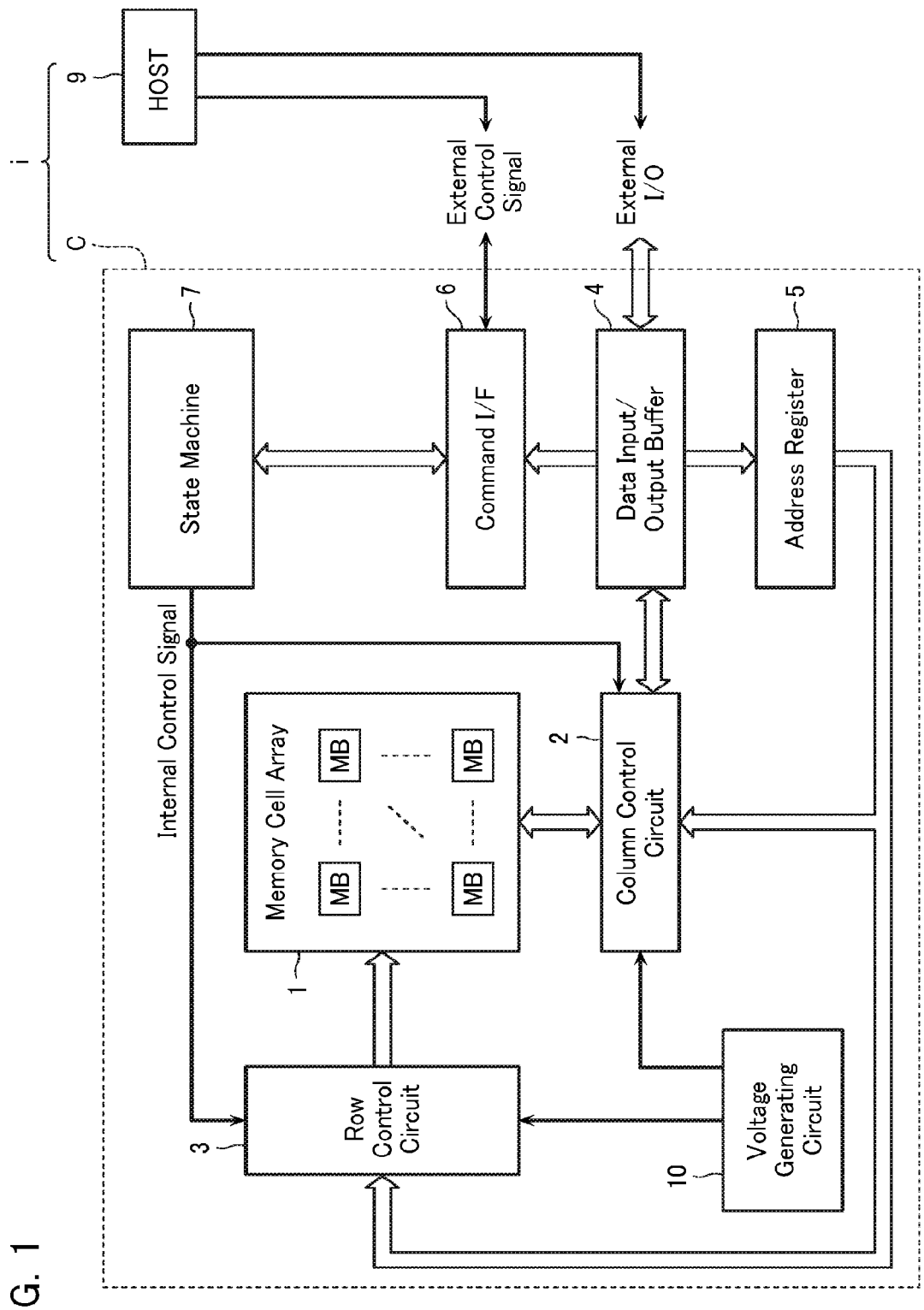
FIG. 1 is a block diagram of a nonvolatile semiconductor memory device according to a first embodiment.

FIG. 1 is a block diagram of a nonvolatile semiconductor memory device according to a first embodiment. Note that the nonvolatile semiconductor memory device referred to herein means, for example, the likes of a chip C storing user data or an electronic device i (for example, a smartphone, a mobile phone, a tablet terminal, a music player, a wearable terminal, and so on) installed with this chip C. Moreover, user data refers to, for example, data expressing contents (a character string, a sound, an image, a moving picture, and so on) utilized by a user, and is expressed by a combination of "0"s and "1"s.

The electronic device i comprises the chip C and a host 9 controlling this chip C. The chip C comprises: a memory cell array 1; and a column control circuit 2, a row control circuit 3, a data input/output buffer 4, an address register 5, a command interface 6, a state machine 7, and a voltage generating circuit 10 that control this memory cell array 1. The memory cell array 1 comprises a plurality of memory blocks MB. These memory blocks MB each record user data. The column control circuit 2 comprises an unshown sense amplifier, and performs read of user data, and so on. Moreover, the column control circuit 2, when performing write of user data, transfers a voltage to the memory cell array 1, according to inputted user data. The row control circuit 3 specifies a position for performing read or write of user data in the memory cell array 1, according to inputted address data. The data input/output buffer 4 performs input/output control of user data, address data, and command data. The address register 5 stores address data and supplies the address data to the column control circuit 2 and the row control circuit 3. The state machine 7 receives an external control signal from the host 9, via the command interface 6, and inputs an internal control signal to the column control circuit 2 and the row control circuit 3. The voltage generating circuit 10 generates a voltage and supplies the voltage to the column control circuit 2 and the row control circuit 3.

Figure 2:
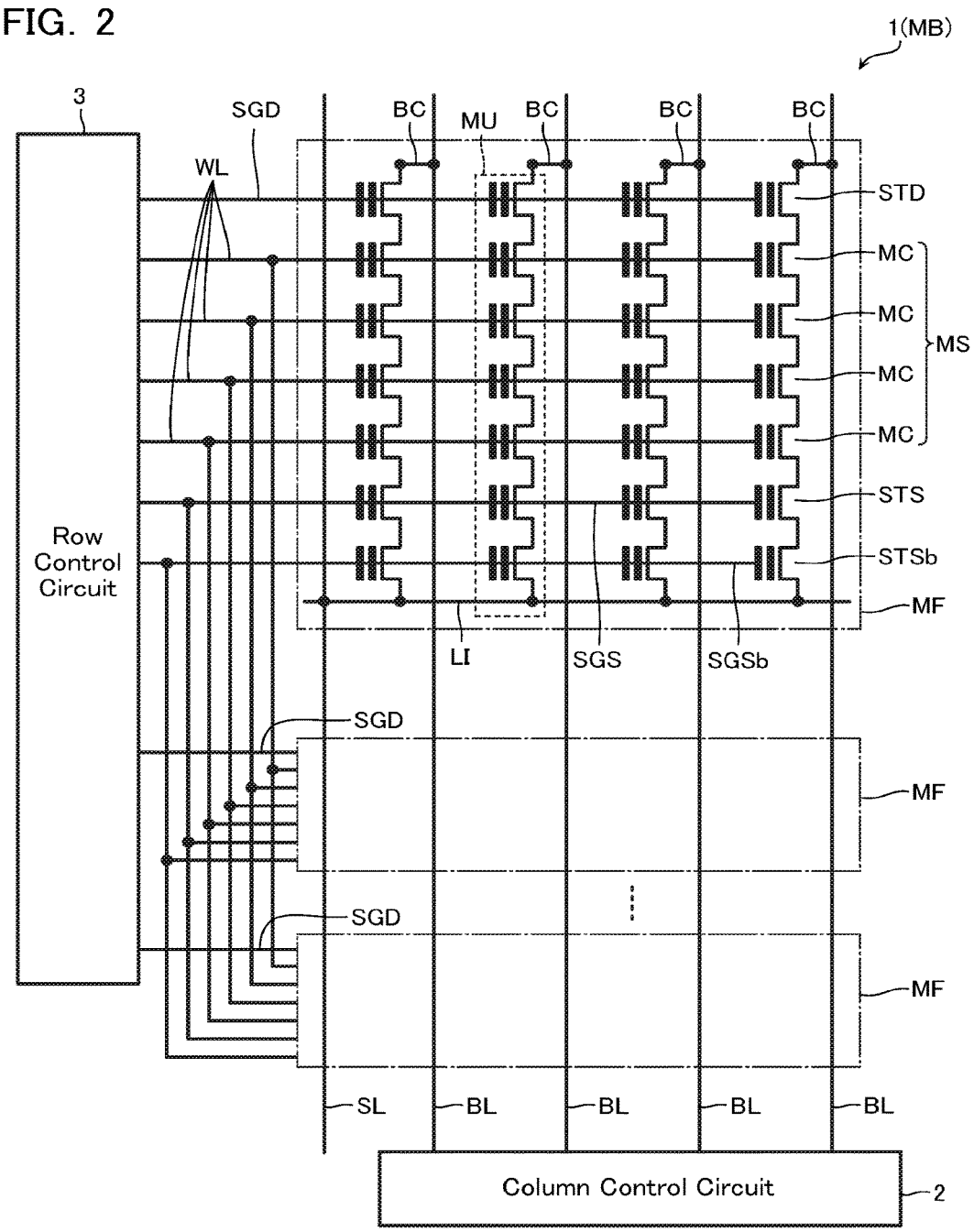
FIG. 2 is a circuit diagram showing a configuration of part of the same nonvolatile semiconductor memory device.

FIG. 2 is an equivalent circuit diagram showing a configuration of the memory block MB configuring the memory cell array 1. The memory block MB is connected to the column control circuit 2 via a bit line BL, to the row control circuit 3 via a word line WL, and to an unshown source line driver via a source line SL. Note that for convenience of explanation, in FIG. 2, part of the configuration is omitted.

The memory block MB comprises a plurality of memory fingers MF. The memory finger MF comprises a plurality of memory units MU. One ends of these plurality of memory units MU are respectively connected to the bit lines BL via bit line contacts BC. Moreover, the other ends of these plurality of memory units MU are each connected to the source line SL via a common source line contact LI. The memory unit MU comprises a drain side select gate transistor STD, a memory string MS, a source side select gate transistor STS, and a lowermost layer source side select gate transistor STSb that are connected in series between the bit line contact BC and the source line contact LI.

The memory string MS comprises a plurality of memory cells MC connected in series. The memory cell MC is a field effect transistor that comprises: a first semiconductor layer functioning as a channel body; a gate insulating layer capable of accumulating a charge; and a control gate electrode, and stores a one-bit portion or a multiple-bit portion of data configuring user data. A threshold voltage of the memory cell MC changes according to a charge amount in the gate insulating layer. Note that the word lines WL are respectively connected to the control gate electrodes of the plurality of memory cells MC belonging to an identical memory string MS. The word line WL is provided commonly for all of the memory strings MS in the memory block MB.

The drain side select gate transistor STD, the source side select gate transistor STS, and the lowermost layer source side select gate transistor STSb are field effect transistors that comprise: a first semiconductor layer functioning as a channel body; and a control gate electrode. A common drain side select gate line SGD is connected to the plurality of drain side select gate transistors STD belonging to an identical memory finger MF. Moreover, a common source side select gate line SGS and a common lowermost layer source side select gate line SGSb are respectively connected to the control gate electrodes of the pluralities of source side select gate transistors STS and lowermost layer source side select gate transistors STSb that belong to an identical memory block MB.

Note that in the description below, the lowermost layer source side select gate transistor STSb, the source side select gate transistor STS, and the drain side select gate transistor STD will sometimes simply be called select gate transistors (STSb, STS, STD). Moreover, the lowermost layer source side select gate line SGSb, the source side select gate line SGS, and the drain side select gate line SGD will sometimes simply be called select gate lines (SGSb, SGS, SGD).

Figure 3:
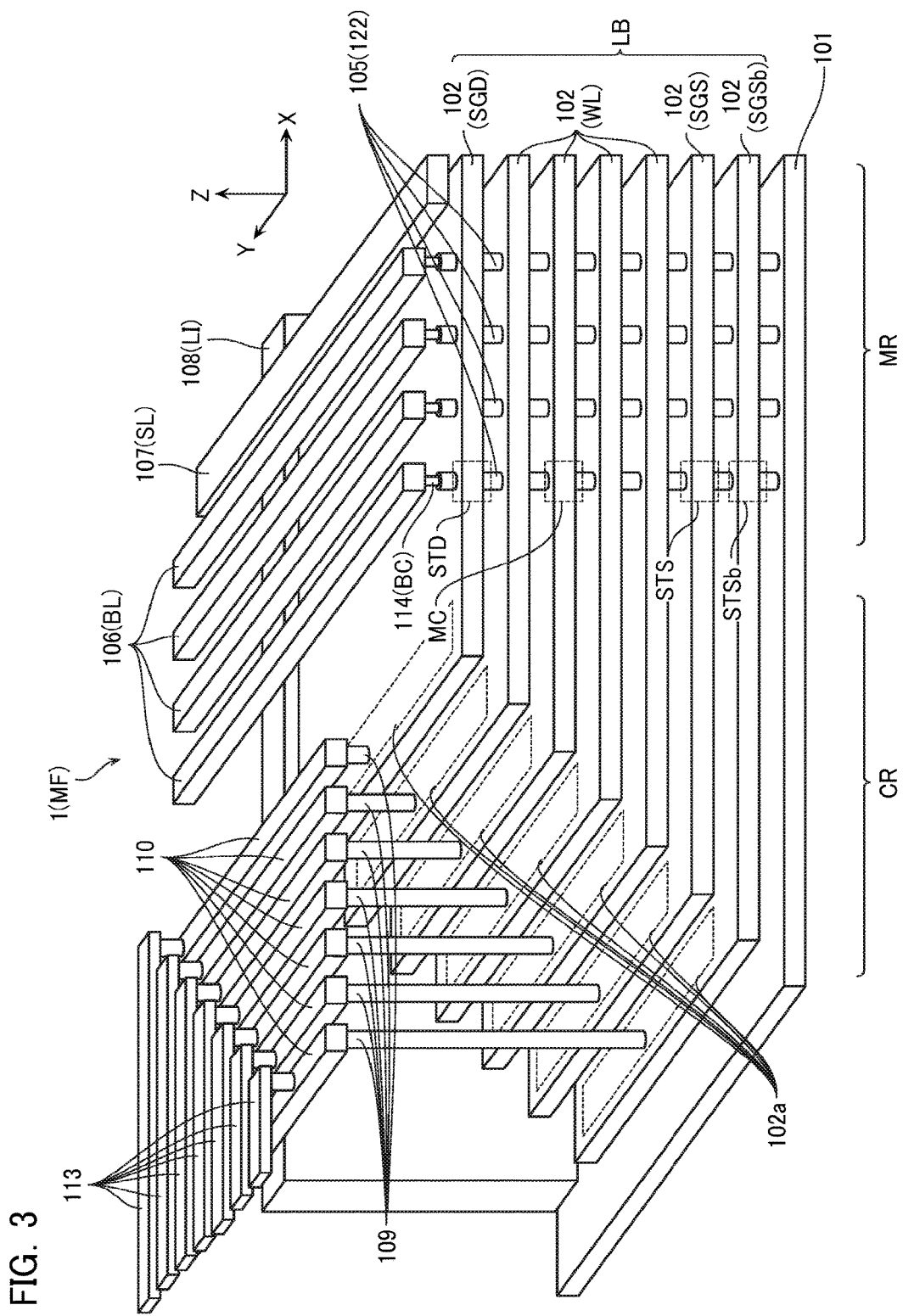
FIG. 3 is a perspective view showing a configuration of part of the same nonvolatile semiconductor memory device.

FIG. 3 is a schematic perspective view showing a configuration of part of the memory finger MF. Note that FIG. 3 explains a three-dimensional structure of the likes of a wiring line or the memory cell MC, and does not show an inter-layer insulating layer provided between the wiring lines, and so on. In addition, FIG. 3 is shown for explanation, and a specific configuration may be appropriately changed. Moreover, in the description below, a certain direction parallel to an upper surface of a substrate 101 is assumed to be an X direction, a direction parallel to the upper surface of the substrate 101 and perpendicular to the X direction is assumed to be a Y direction, and a direction perpendicular to the upper surface of the substrate 101 is assumed to be a Z direction. The description below exemplifies the case where a first direction corresponds with the Z direction, a second direction corresponds with the Y direction, and a third direction corresponds with the X direction, but these first through third directions need not correspond with the Z, Y, and X directions. Furthermore, in the description below, a surface of an object facing the substrate 101 is assumed to be a lower surface of the object, a surface opposite to the lower surface of the object is assumed to be an upper surface, and a surface facing a direction crossing the first direction is assumed to be a side surface. Additionally, an end of an object nearest to the substrate 101 is assumed to be a lower end of the object, and an end of an object furthest from the substrate 101 is assumed to be an upper end. Additionally, a direction approaching the substrate is assumed to be downward, and a direction going away from the substrate is assumed to be upward.

The memory finger MF includes: the substrate 101; a stacked body LB provided above the substrate 101; and a memory columnar body 105 of a substantially circular column shape whose side surface is covered by the stacked body LB.

The substrate 101 is a semiconductor substrate configured from the likes of monocrystalline silicon (Si), for example. The substrate 101 extends in the X and Y directions. The substrate 101 comprises a double well structure that includes an N type impurity layer on the upper surface of the semiconductor substrate and that further includes a P type impurity layer in this N type impurity layer. A memory region MR provided with the likes of the memory cell MC, and a contact region CR provided with the likes of a contact 109, are provided on the substrate 101.

The stacked body LB includes a plurality of conductive layers 102 stacked above the substrate 101. These conductive layers 102 respectively function as the word line WL and control gate electrode of the memory cell MC, or as the select gate lines (SGSb, SGS, SGD) and control gate electrodes of the select gate transistors (STSb, STS, STD). The conductive layer 102 is configured from a conductive layer of the likes of tungsten (W), for example. The conductive layer 102 extends in the X direction and is provided straddling the memory region MR and the contact region CR. In addition, the conductive layers 102 each comprise a contact part 102a connected to the contact 109 (third contact). The conductive layer 102 is connected to the row control circuit 3 (FIGS. 1 and 2), via the contact 109 extending in the Z direction, a conductive layer 110 (second conductive layer) extending in the Y direction, and a conductive layer 113 extending in the X direction. Note that the contact 109, the conductive layer 110, and the conductive layer 113 are configured from a conductive layer of the likes of tungsten (W).

A plurality of the memory columnar bodies 105 are provided in the memory region MR. The memory columnar body 105 has a circular column shape extending in the Z direction and, in conjunction with the stacked body LB, configures the memory string MS, and so on. That is, an intersection of the conductive layer 102 and the memory columnar body 105 functions as the memory cell MC or the select gate transistors (STSb, STS, STD). The memory columnar body 105 includes a first semiconductor layer 122 extending in the Z direction. The first semiconductor layer 122 faces the plurality of conductive layers 102 and functions as a channel body of the memory cell MC and the select gate transistors (STSb, STS, STD). A lower end of the first semiconductor layer 122 is electrically connected, via a second semiconductor layer (the substrate 101), to a lower end of a conductive layer 108 (second contact) functioning as the source line contact LI. The conductive layer 108 is electrically connected to the unshown source line driver, via a conductive layer 107 functioning as the source line SL. Note that the second semiconductor layer may be provided separately from the substrate 101 or a conductive layer connected to lower ends of the memory columnar body 105 and the conductive layer 108 may be provided. An upper end of the first semiconductor layer 122 is electrically connected to a conductive layer 114 (first contact) functioning as the bit line contact BC. The conductive layer 114 is electrically connected to the column control circuit 2 (FIGS. 1 and 2) via a conductive layer 106 functioning as the bit line BL. Note that the conductive layer 106, the conductive layer 107, the conductive layer 108, and the conductive layer 114 are configured from a conductive layer of the likes of tungsten (W). Moreover, pluralities of the conductive layers 106 and the conductive layers 107 are arranged in the X direction, and these conductive layers 106 and 107 each extend in the Y direction. The conductive layer 108 comprises a substantially plate-like shape extending in the X direction and the Z direction along a side surface of the stacked body LB, and is connected, at its lower surface, to the substrate 101. The conductive layers 114 extend in the Z direction and are each connected to one first semiconductor layer 122 and one conductive layer 106. Note that the conductive layer 114 may be commonly connected to two first semiconductor layers 122.

Figure 4:
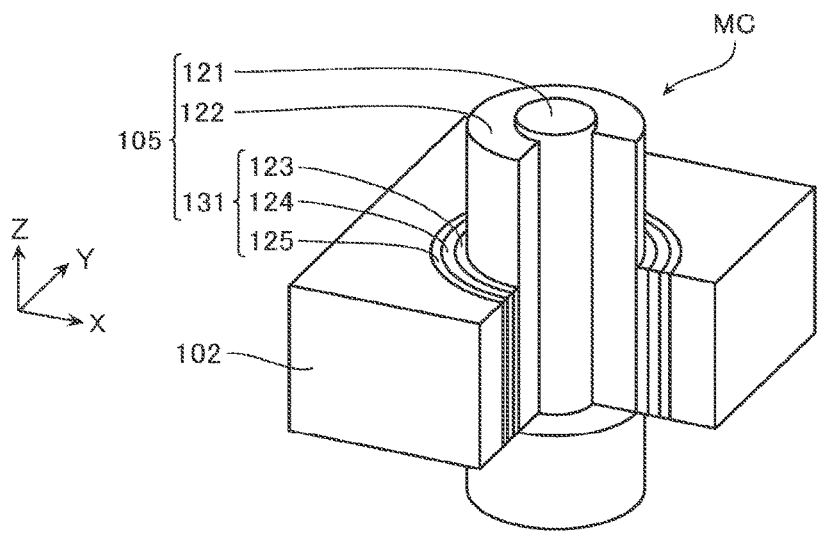
FIG. 4 is a perspective view showing a configuration of part of the same nonvolatile semiconductor memory device.

FIG. 4 is a schematic perspective view showing a configuration of the memory cell MC. Note that FIG. 4 shows the configuration of the memory cell MC, but the select gate transistors (STSb, STS, STD) may also be configured similarly to the memory cell MC. Note that in FIG. 4, part of the configuration is omitted.

The memory cell MC is provided at an intersection of the conductive layer 102 and the memory columnar body 105. The memory columnar body 105 comprises: a core insulating layer 121 of a circular column shape extending in the Z direction; the first semiconductor layer 122 covering a side surface of the core insulating layer 121; and a gate insulating layer 131 covering a side surface of the first semiconductor layer 122. The gate insulating layer 131 comprises: a tunnel insulating layer 123 covering the side surface of the first semiconductor layer 122; a charge accumulation layer 124 covering a side surface of the tunnel insulating layer 123; and a block insulating layer 125 covering a side surface of the charge accumulation layer 124.

The core insulating layer 121 is configured from an insulating layer of the likes of silicon oxide ($SiO_2$), for example. The first semiconductor layer 122 is configured from a semiconductor layer of the likes of polysilicon, for example, and is formed in a substantially cylindrical shape extending in the Z direction along the side surface of the core insulating layer 121. The gate insulating layer 131 is provided between the conductive layer 102 and the first semiconductor layer 122, and is formed in a substantially cylindrical shape extending in the Z direction along the side surface of the first semiconductor layer 122. The tunnel insulating layer 123 is configured from an insulating layer of the likes of silicon oxide ($SiO_2$), for example. The charge accumulation layer 124 is configured from an insulating layer capable of accumulating a charge, of the likes of silicon nitride ($Si_3N_4$), for example. The block insulating layer 125 is configured from an insulating layer of the likes of silicon oxide ($SiO_2$) or alumina ($Al_2O_3$), for example.

Figure 5:
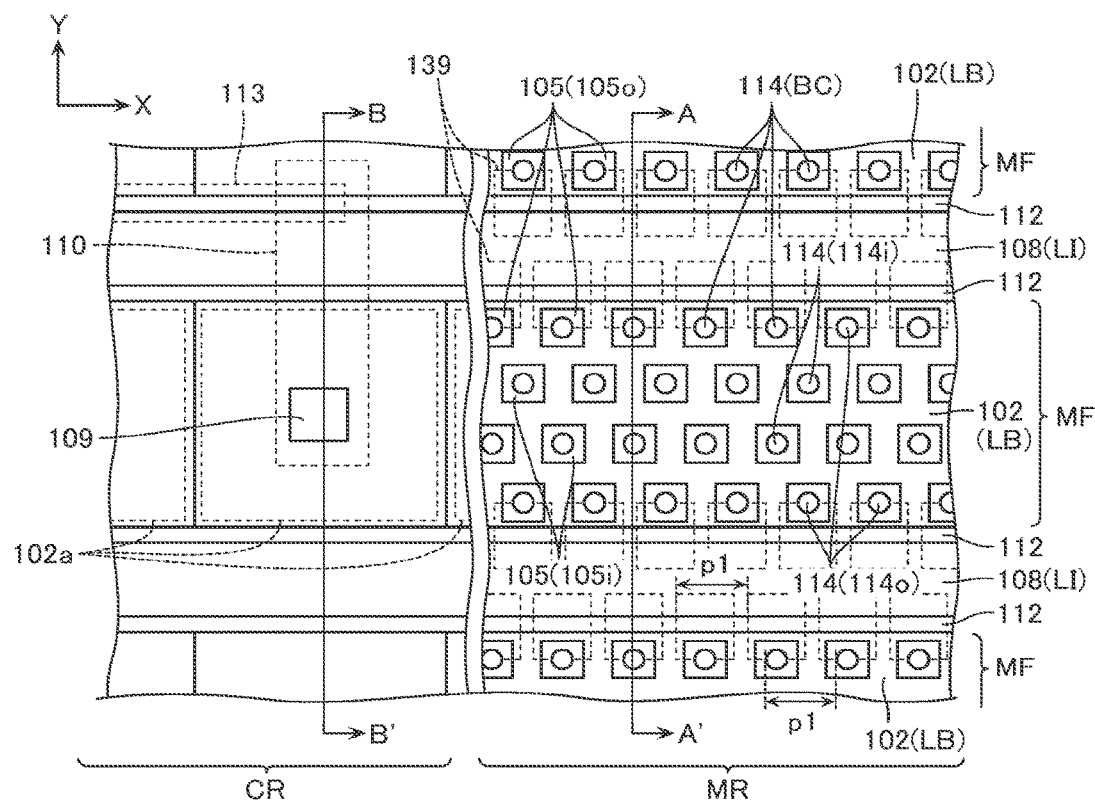
FIG. 5 is a plan view showing a configuration of part of the same nonvolatile semiconductor memory device.
Figure 6:
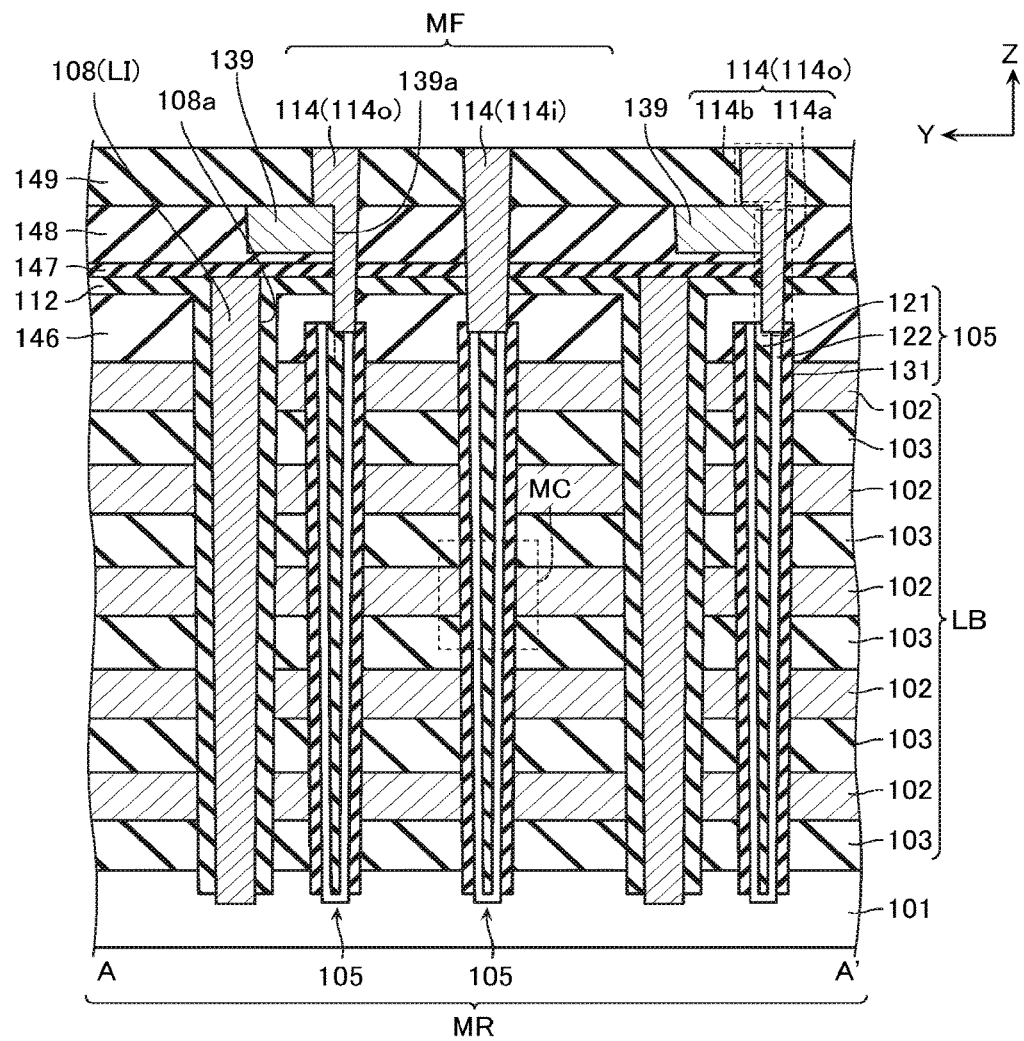
FIG. 6 is a cross-sectional view showing a configuration of part of the same nonvolatile semiconductor memory device.
Figure 7:
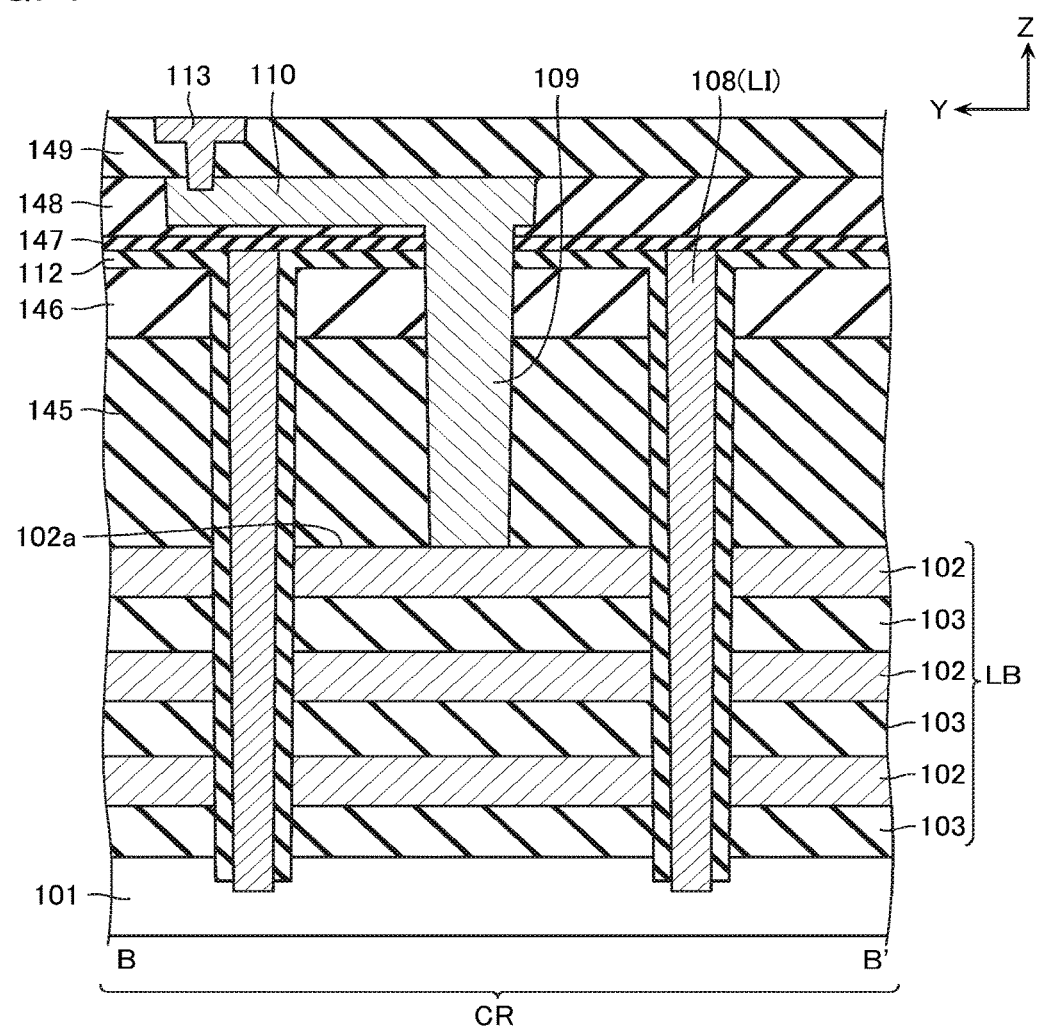
FIG. 7 is a cross-sectional view showing a configuration of part of the same nonvolatile semiconductor memory device.
Figure 8:
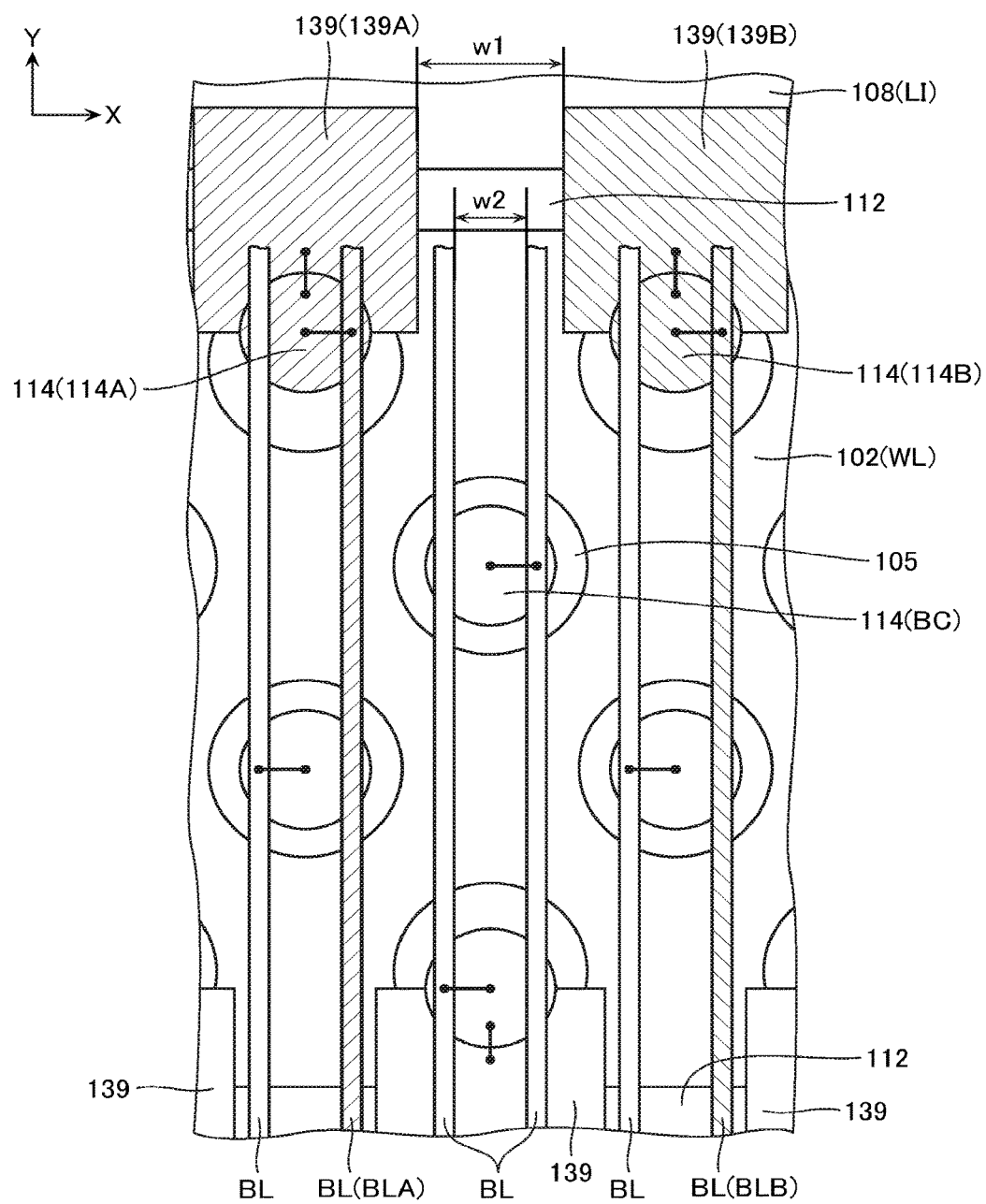
FIG. 8 is a plan view showing a configuration of part of the same nonvolatile semiconductor memory device.

FIG. 5 is a plan view showing a configuration of part of the same nonvolatile semiconductor memory device. FIGS. 6 and 7 are cross-sectional views showing configurations of parts of the same nonvolatile semiconductor memory device, and respectively show cross sections of a portion indicated by the line AA' and a portion indicated by the line BB', of FIG. 5. FIG. 8 is an enlarged view of part of FIG. 5. Note that FIGS. 5 to 8 do not show the likes of the conductive layer 107 described with reference to FIG. 3. Moreover, FIGS. 5 to 8 do show the likes of an inter-layer insulating layer 103 or first conductive layer 139 whose descriptions were omitted in FIG. 3. Moreover, FIGS. 5 to 8 are shown for explanation, and a specific configuration may be appropriately changed.

As shown in FIG. 5, the nonvolatile semiconductor memory device according to the present embodiment comprises a plurality of the memory fingers MF arranged in the Y direction via the conductive layer 108 and a spacer insulating layer 112. These plurality of memory fingers MF, the conductive layer 108, and the spacer insulating layer 112 each extend in the X direction, and are provided along the memory region MR and the contact region CR.

The memory fingers MF each comprise a plurality of the memory columnar bodies 105 arranged staggered. The memory finger MF includes four columns each configured from a plurality of the memory columnar bodies 105 arranged in the X direction. Moreover, the conductive layers 114 are respectively connected to the memory columnar bodies 105. Hereafter, a memory columnar body 105 included in the outer two columns will sometimes be called an outer memory columnar body 105o, and a memory columnar body 105 included in the inner two columns will sometimes be called an inner memory columnar body 105i. Moreover, a conductive layer 114 connected to an outer memory columnar body 105o will sometimes be called an outer conductive layer 114o, and a conductive layer 114 connected to an inner memory columnar body 105i will sometimes be called an inner conductive layer 114i.

As shown in FIG. 6, the stacked body LB, in addition to including the plurality of conductive layers 102, includes also the inter-layer insulating layer 103 provided between these conductive layers 102. An upper surface of the stacked body LB is covered by an inter-layer insulating layer 146. The memory columnar body 105 extends in the Z direction penetrating part of the inter-layer insulating layer 146 in addition to the stacked body LB. Side surfaces of the stacked body LB and the inter-layer insulating layer 146, and an upper surface of the inter-layer insulating layer 146 are covered by the spacer insulating layer 112. Moreover, the conductive layer 108 extending in the Z direction is provided, via the spacer insulating layer 112, between the stacked bodies LB adjacent in the Y direction. The inter-layer insulating layer 103, the inter-layer insulating layer 146, and the spacer insulating layer 112 are configured from an insulating layer of the likes of silicon oxide ($SiO_2$), for example.

Upper surfaces of the conductive layer 108 and the spacer insulating layer 112 are covered by an etching stopper layer 147 and an insulating layer 148. Moreover, a recess is formed in a portion of an upper surface of the insulating layer 148 positioned above the conductive layer 108 and the first conductive layer 139 is implanted in this recess. An upper surface of the first conductive layer 139 is formed continuously with the upper surface of the insulating layer 148. The insulating layer 148 is configured from an insulating layer of the likes of silicon oxide ($SiO_2$), for example. The etching stopper layer 147 is configured from an insulating layer whose etching rate is lower than that of the insulating layer 148, of the likes of silicon nitride ($Si_3N_4$), for example. The first conductive layer 139 is configured from a material such as tungsten (W). Note that a height (distance in the Z direction from the upper surface of the substrate 101) of the upper surface of the first conductive layer 139 is equal to a height of an upper surface of the conductive layer 110 (second conductive layer; refer to FIGS. 3 and 7). The first conductive layer 139 has a role of preventing dishing of the insulating layer 148 in the memory region MR, when forming the conductive layer 110.

The upper surfaces of the first conductive layer 139 and the insulating layer 148 are covered by an insulating layer 149. Moreover, the conductive layer 114 extends in the Z direction penetrating the insulating layer 149, the insulating layer 148, the etching stopper layer 147, the spacer insulating layer 112, and part of the inter-layer insulating layer 146. An upper surface of the conductive layer 114 is formed continuously with an upper surface of the insulating layer 149. The insulating layer 149 is configured from an insulating layer of the likes of silicon oxide ($SiO_2$), for example.

As shown in FIG. 7, an upper surface of the contact part 102a of the conductive layer 102 is covered by an inter-layer insulating layer 145 and the above-mentioned inter-layer insulating layer 146 (FIG. 6). The inter-layer insulating layer 146, the spacer insulating layer 112, and the conductive layer 108 are formed substantially similarly to in the memory region MR, also in the contact region CR. The inter-layer insulating layer 145 is configured from an insulating layer of the likes of silicon oxide ($SiO_2$), for example.

The upper surfaces of the conductive layer 108 and the spacer insulating layer 112 are covered by the etching stopper layer 147 and the insulating layer 148, also in the contact region CR. The contact 109 extends in the Z direction penetrating the insulating layer 148, the etching stopper layer 147, the spacer insulating layer 112, the inter-layer insulating layer 146, and the inter-layer insulating layer 145. Moreover, a trench extending in the Y direction is formed in the upper surface of the insulating layer 148, and the conductive layer 110 (refer to FIG. 3) is implanted in this trench. The upper surface of the conductive layer 110 is formed continuously with the upper surface of the insulating layer 148. Moreover, the conductive layer 110 is formed integrally with the contact 109.

The upper surfaces of the conductive layer 110 and the insulating layer 148 are covered by the insulating layer 149. A trench extending in the X direction is formed in the upper surface of the insulating layer 149, and the conductive layer 113 (refer to FIG. 3) is implanted in this trench. An upper surface of the conductive layer 113 is formed continuously with the upper surface of the insulating layer 149. Note that a height of the upper surface of the conductive layer 113 is equal to a height of the upper surface of the conductive layer 114 (FIG. 6).

Now, as shown in FIG. 5, the nonvolatile semiconductor memory device according to the present embodiment comprises a plurality of the first conductive layers 139 formed staggered. The first conductive layers 139 is arranged in plurality in the X direction with a pitch p1 (first pitch) identical to that of the outer conductive layers 114o. Moreover, these plurality of first conductive layers 139 are divided in the X direction, and are electrically independent. Moreover, the first conductive layer 139 and the outer conductive layer 114o are disposed so as to partly overlap in an XY plane. Similarly, the first conductive layer 139 and the conductive layer 108 are disposed so as to partly overlap in the XY plane. Moreover, as shown in FIG. 6, an end 139a closest to the conductive layer 114 of the first conductive layer 139 is closer to the conductive layer 114 (bit line contact BC) than an end 108a closest to the conductive layer 114 of the conductive layer 108 (source line contact LI) is, and contacts the side surface of the conductive layer 114. Furthermore, if a portion of the outer conductive layer 114o positioned more downwardly than the upper surface of the first conductive layer 139 is assumed to be a first portion 114a, and a portion of the outer conductive layer 114o positioned more upwardly than the upper surface of the first conductive layer 139 is assumed to be a second portion 114b, then a width in the Y direction of the first portion 114a is smaller than a width in the Y direction of the second portion 114b. Moreover, a side surface of the first portion 114a contacts the end 139a of the first conductive layer 139.

[Advantages]

Figure 9:
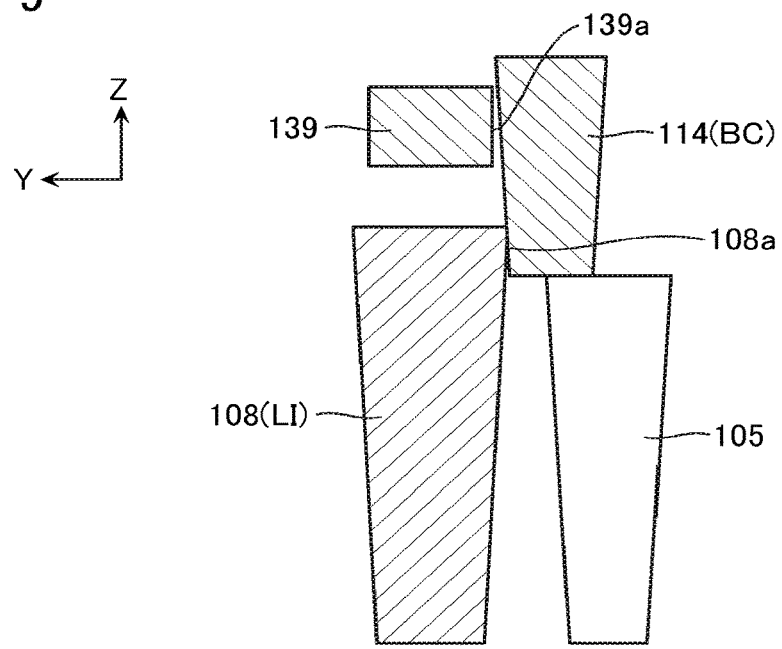
FIG. 9 is a cross-sectional view showing a configuration of part of a nonvolatile semiconductor memory device according to a comparative example.

FIG. 9 is a schematic cross-sectional view showing a configuration of part of a nonvolatile semiconductor memory device according to a comparative example. The nonvolatile semiconductor memory device according to the comparative example is basically configured similarly to the nonvolatile semiconductor memory device according to the first embodiment, but the first conductive layer 139 is positioned directly upwardly of the conductive layer 108. Moreover, the end 139a closest to the conductive layer 114 of the first conductive layer 139 is positioned further from the conductive layer 114 (bit line contact BC) than the end 108a closest to the conductive layer 114 of the conductive layer 108 (source line contact LI) is.

In such a case, if a position of the conductive layer 114 got misaligned in the Y direction when performing lithography or etching, then sometimes, the conductive layer 114 and the conductive layer 108 came into contact causing a short circuit defect, or a distance between the conductive layer 114 and the conductive layer 108 could not be secured, and withstand voltage ended up lowering.

Figure 10:
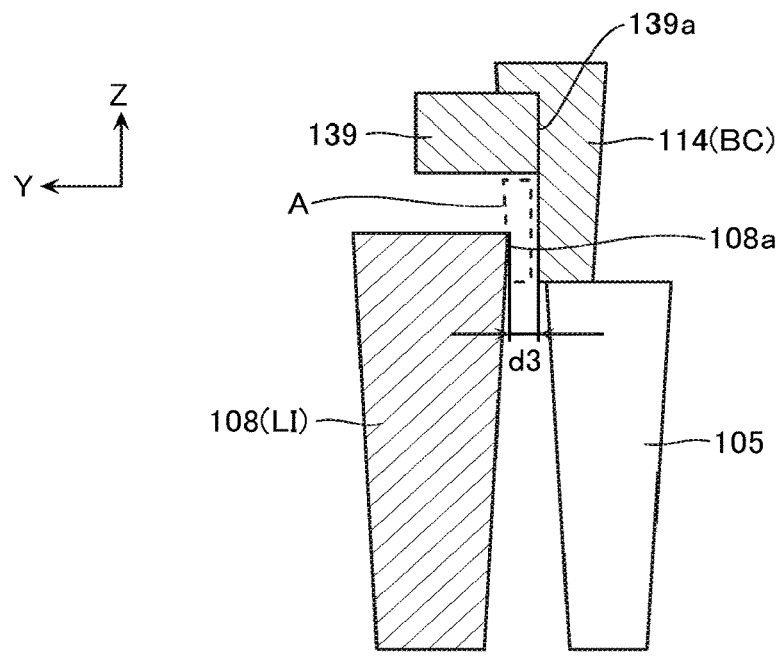
FIG. 10 is a cross-sectional view showing a configuration of part of the nonvolatile semiconductor memory device according to the first embodiment.

In contrast, in the present embodiment, as shown in FIG. 10, the end 139a closest to the conductive layer 114 of the first conductive layer 139 is positioned closer to the conductive layer 114 than the end 108a closest to the conductive layer 114 of the conductive layer 108 is. Such a configuration makes it possible that by using the first conductive layer 139 as an etching stopper (mask) when forming a contact hole where the conductive layer 114 is implanted, an inter-layer insulating layer positioned in a portion A downward of the first conductive layer 139 is prevented from being removed, whereby a distance d3 in the Y direction between the conductive layer 114 and the conductive layer 108 is secured. As a result, occurrence of the likes of the short circuit defect described with reference to FIG. 9 can be suppressed.

Note that as described with reference to FIG. 6, in the present embodiment, the conductive layer 114 and the first conductive layer 139 contact each other. Therefore, as shown in FIG. 8, the conductive layer 114 and the first conductive layer 139 are electrically connected. Therefore, since conductive layers 114A and 114B adjacent in the X direction face each other via first conductive layers 139A and 139B, electrostatic capacity between the conductive layers 114 ends up increasing. If electrostatic capacity between the conductive layers 114 ends up increasing, then there is a risk of an effect being exerted on operation speed of the nonvolatile semiconductor memory device.

Accordingly, in the present embodiment, a distance w1 between the first conductive layers 139 adjacent in the X direction is made larger than a distance w2 between the bit lines BL adjacent in the X direction. In such a mode, electrostatic capacity between the first conductive layers 139A and 139B becomes sufficiently smaller compared to electrostatic capacity between the bit lines BL adjacent in the X direction. Therefore, the effect on operation speed of the nonvolatile semiconductor memory device can be reduced.

Moreover, in the present embodiment, another bit line BL is provided between a bit line BLA electrically connected to the first conductive layer 139A and a bit line BLB electrically connected to the first conductive layer 139B adjacent in the X direction to the first conductive layer 139A. In such a mode, electrostatic capacity between the first conductive layers 139A and 139B does not affect electrostatic capacity between the bit lines BL. In such a mode, electrostatic capacity between the first conductive layers 139A and 139B substantially has no effect on operation speed of the nonvolatile semiconductor memory device.

[Method of Manufacturing]

FIGS. 11 to 24 are cross-sectional views for explaining a method of manufacturing the nonvolatile semiconductor memory device according to the present embodiment. FIGS. 11, 13, 15, 17, 19, 21 and 23 show cross sections corresponding to FIG. 6 and FIGS. 12, 14, 16, 18, 20, 22 and 24 show cross sections corresponding to FIG. 7.

Figure 11:
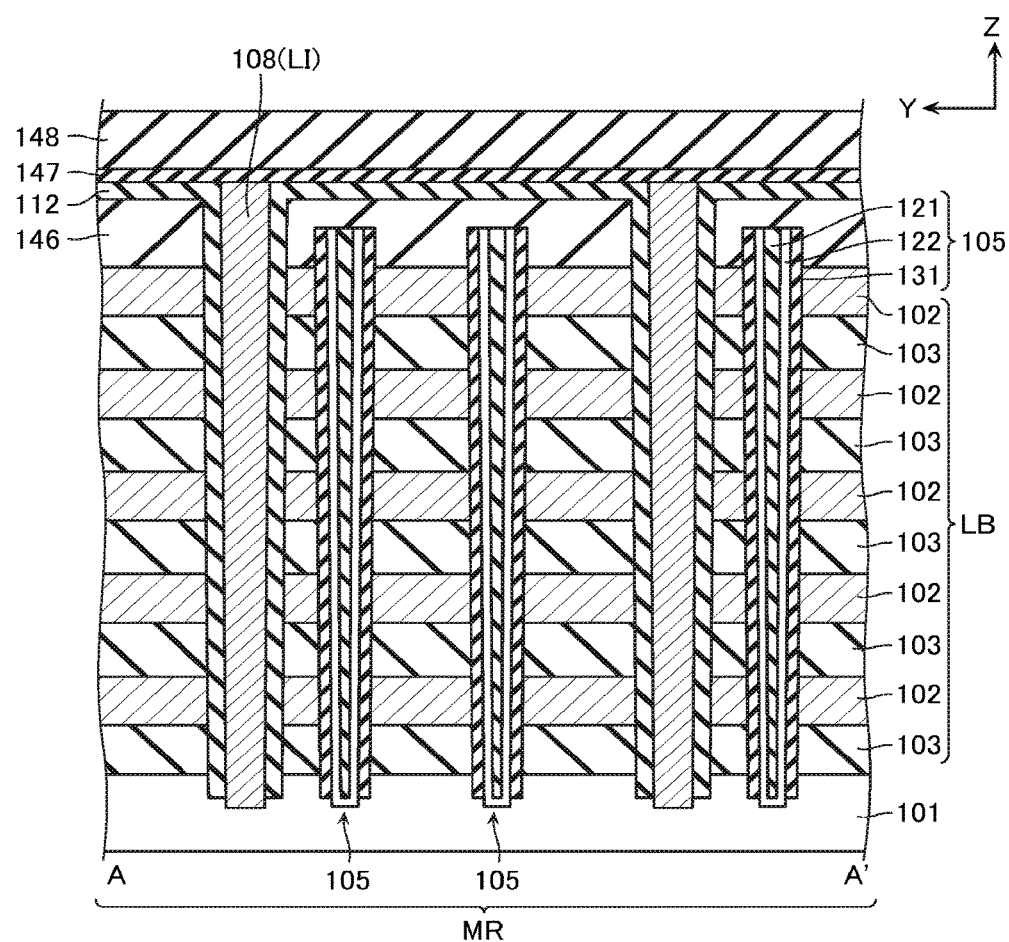
FIGS. 11 to 24 are cross-sectional views for explaining a method of manufacturing the nonvolatile semiconductor memory device according to the first embodiment.
Figure 12:
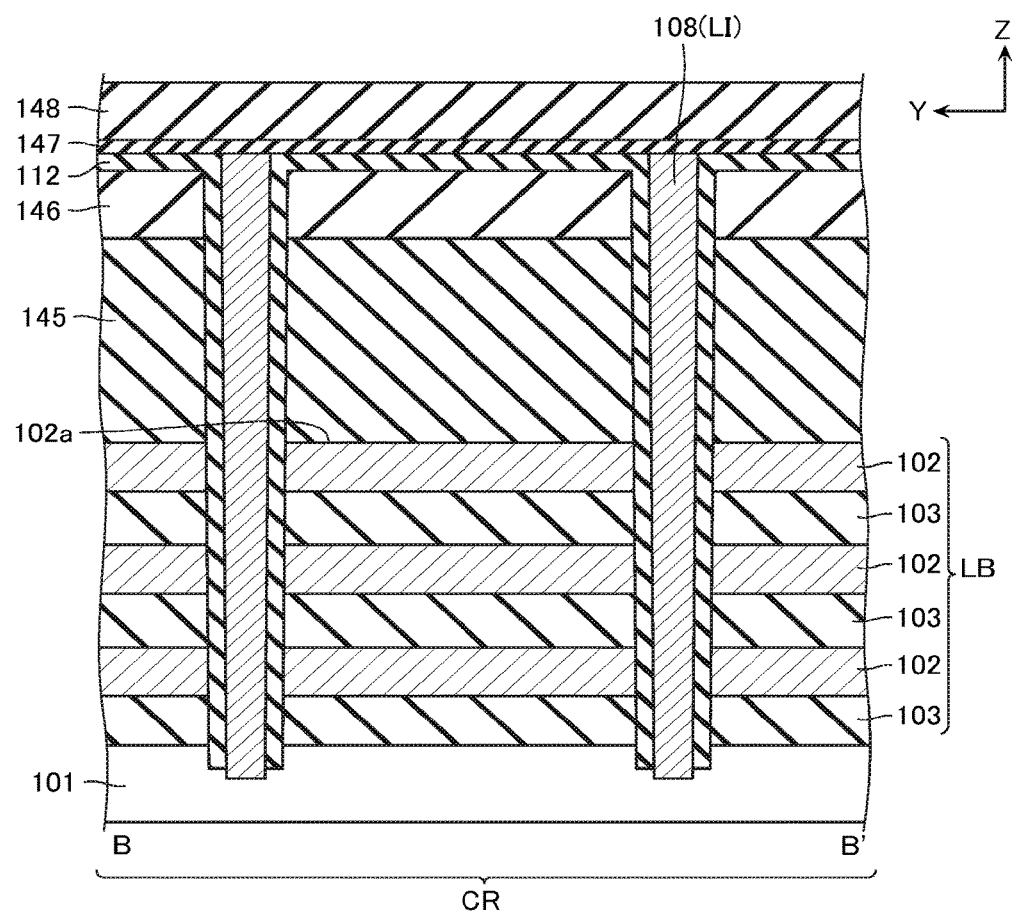

In the method of manufacturing according to the present embodiment, first, as shown in FIGS. 11 and 12, the stacked body LB, the memory columnar body 105, and the conductive layer 108 functioning as the source line contact LI that were explained with reference to FIGS. 5 to 7, are formed. For example, pluralities of silicon oxide ($SiO_2$) and silicon nitride ($Si_3N_4$) are stacked alternately to form a stacked body in the memory region MR and the contact region CR on the substrate 101. Next, a resist is coated on this stacked body, slimming of the resist, wet etching using phosphoric acid, and wet etching using hydrofluoric acid are repeatedly performed, and a step-shaped structure like that shown in FIG. 3 is formed in the contact region CR. Next, this step-shaped structure is covered by the inter-layer insulating layer 145 (FIG. 12). Next, part of the inter-layer insulating layer 146 having staggered through holes is formed on upper surfaces of the stacked body and the inter-layer insulating layer 145, a via hole is formed by a method such as RIE (Reactive Ion Etching) using this part of the inter-layer insulating layer 146 as a mask, and the memory columnar body 105 (FIG. 11) is formed on the inside of this via hole. Next, the remaining part of the inter-layer insulating layer 146 having a plurality of slits extending in the X direction, is formed on upper surfaces of these configurations, and a trench is formed by a method such as RIE using the inter-layer insulating layer 146 as a mask. Next, the silicon nitride ($Si_3N_4$) in the stacked body is removed via this trench, and the conductive layer 102 is formed therein, whereby the stacked body LB is formed. Next, the spacer insulating layer 112 and the conductive layer 108 are formed on the inside of the trench.

Next, the etching stopper layer 147 of the likes of silicon nitride and the insulating layer 148 of the likes of silicon oxide ($SiO_2$) are formed on upper surfaces of the spacer insulating layer 112 and the conductive layer 108. The etching stopper layer 147 and the insulating layer 148 are formed by a method such as CVD (Chemical Vapor Deposition), for example.

Figure 13:
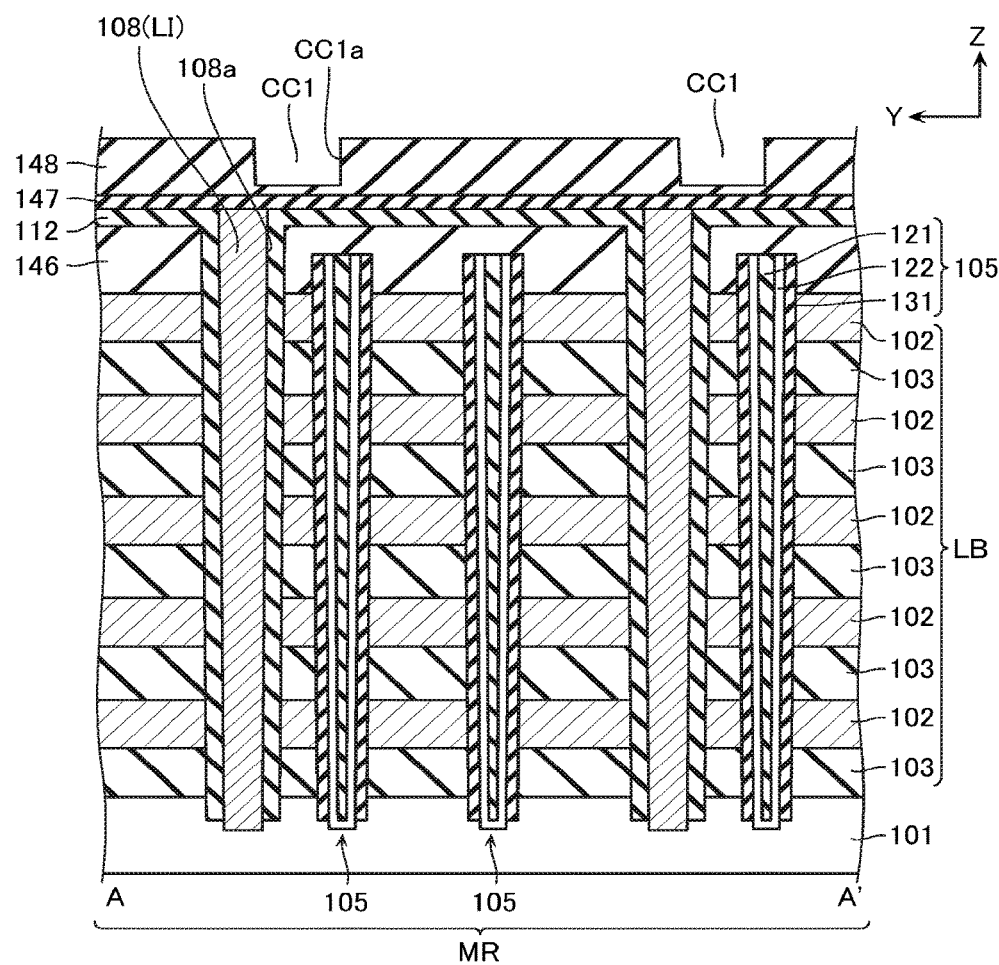
Figure 14:
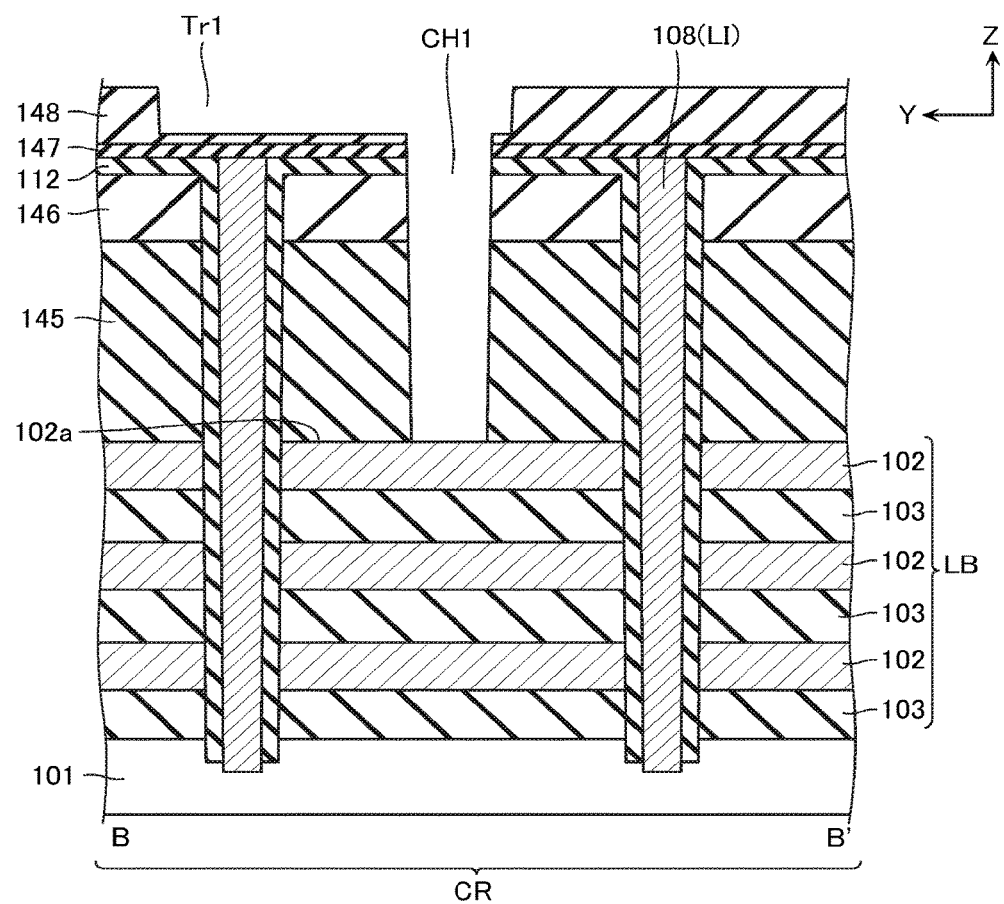

Next, as shown in FIGS. 13 and 14, a contact hole CH1 and a trench Tr1 are formed in the contact region CR, and a recess CC1 is formed in the memory region MR. As shown in FIG. 14, the contact hole CH1 is a via hole having a shape corresponding to that of the contact 109, and penetrates the insulating layer 148, the etching stopper layer 147, the spacer insulating layer 112, the inter-layer insulating layer 146, and the inter-layer insulating layer 145 to expose an upper surface of the contact part 102a of the conductive layer 102. The trench Tr1 is a trench having a shape corresponding to that of the conductive layer 110, and is formed in the insulating layer 148. As shown in FIG. 13, the recess CC1 is a recess having a shape corresponding to that of the first conductive layer 139, and is formed in the insulating layer 148. Moreover, an end CC1a in the Y direction of the recess CC1 is provided closer to the memory columnar body 105 than the end 108a in the Y direction of the conductive layer 108 is. Note that these contact hole CH1, trench Tr1, and recess CC1 are formed by a method such as RIE (Reactive Ion Etching), for example.

Figure 15:
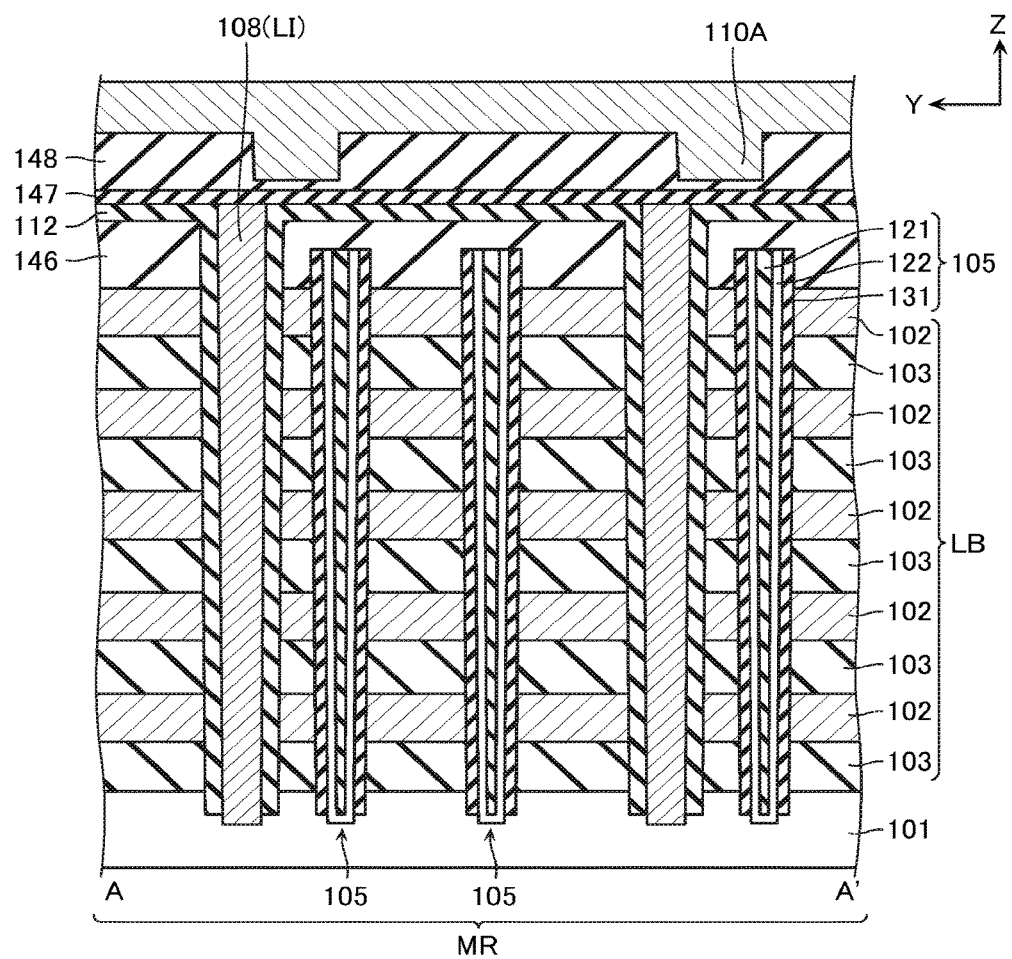
Figure 16:
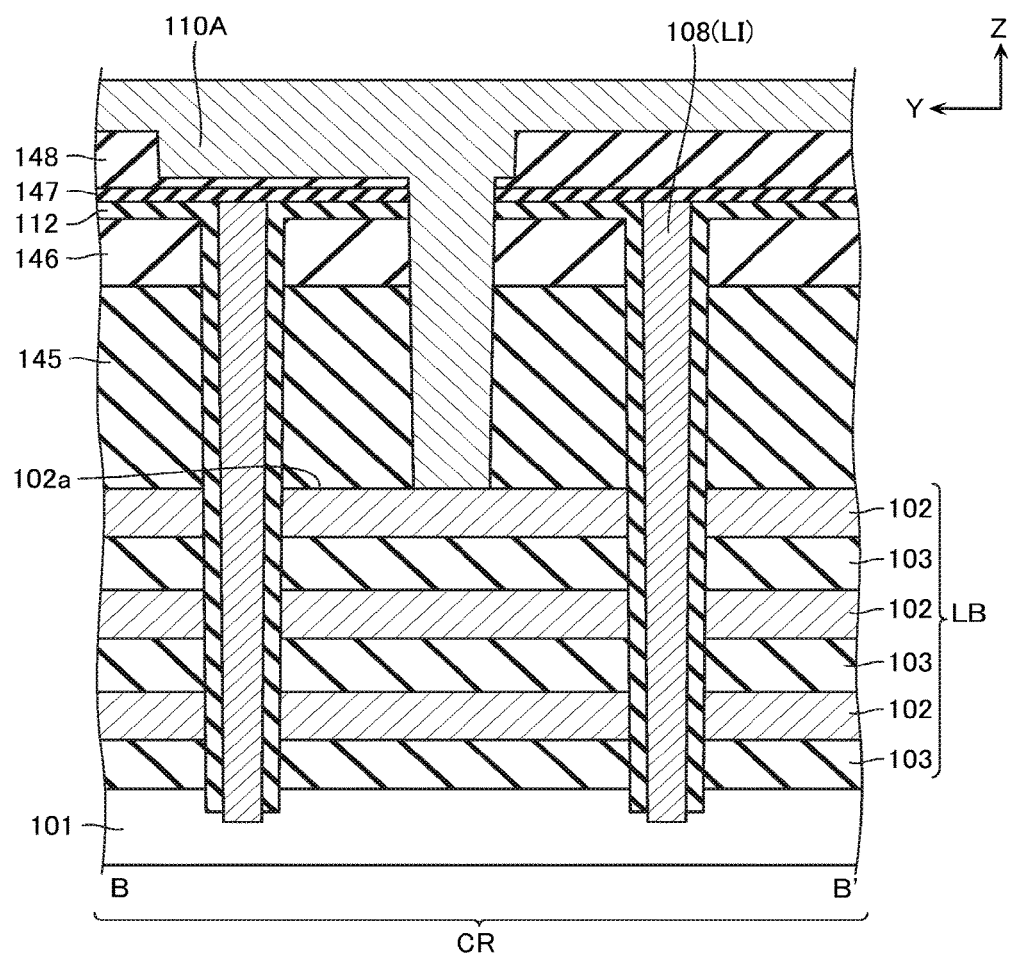

Next, as shown in FIGS. 15 and 16, a conductive layer 110A of the likes of tungsten (W) is formed so as to bury these contact hole CH1, trench Tr1, and recess CC1. The conductive layer 110A is formed by a method such as CVD, for example.

Figure 17:
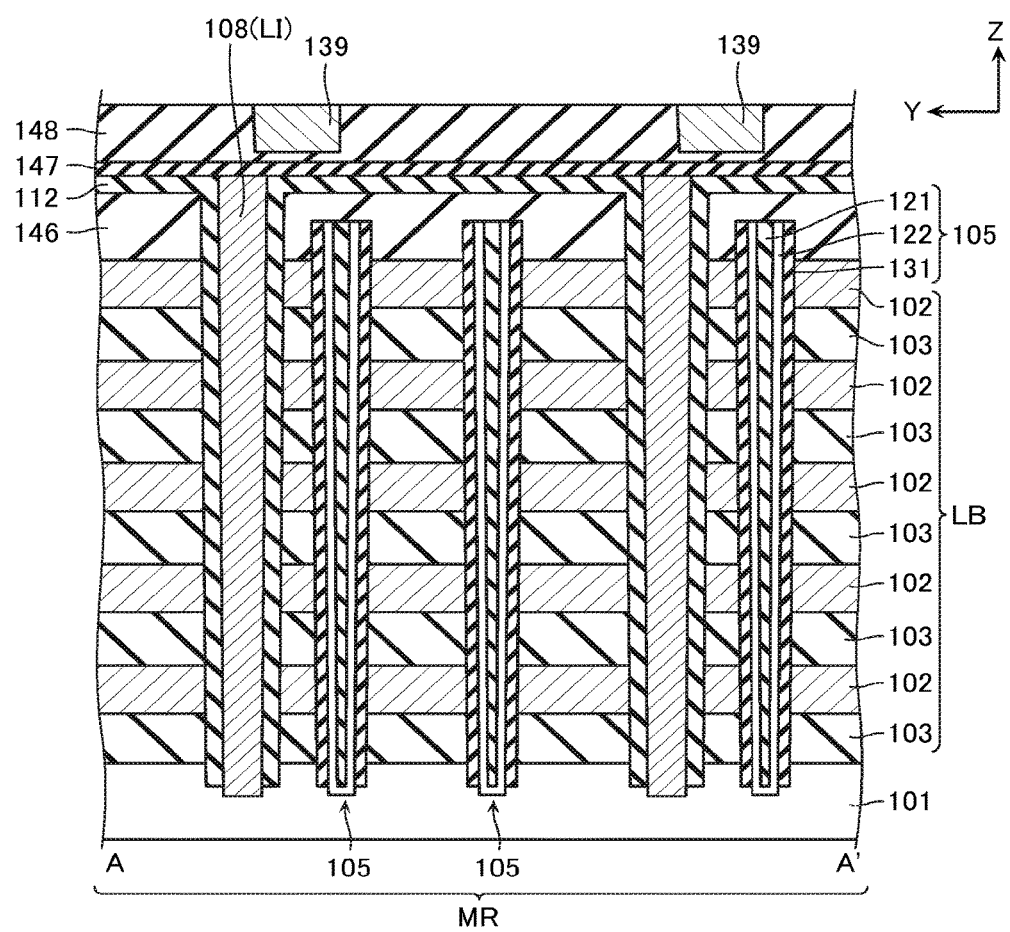
Figure 18:
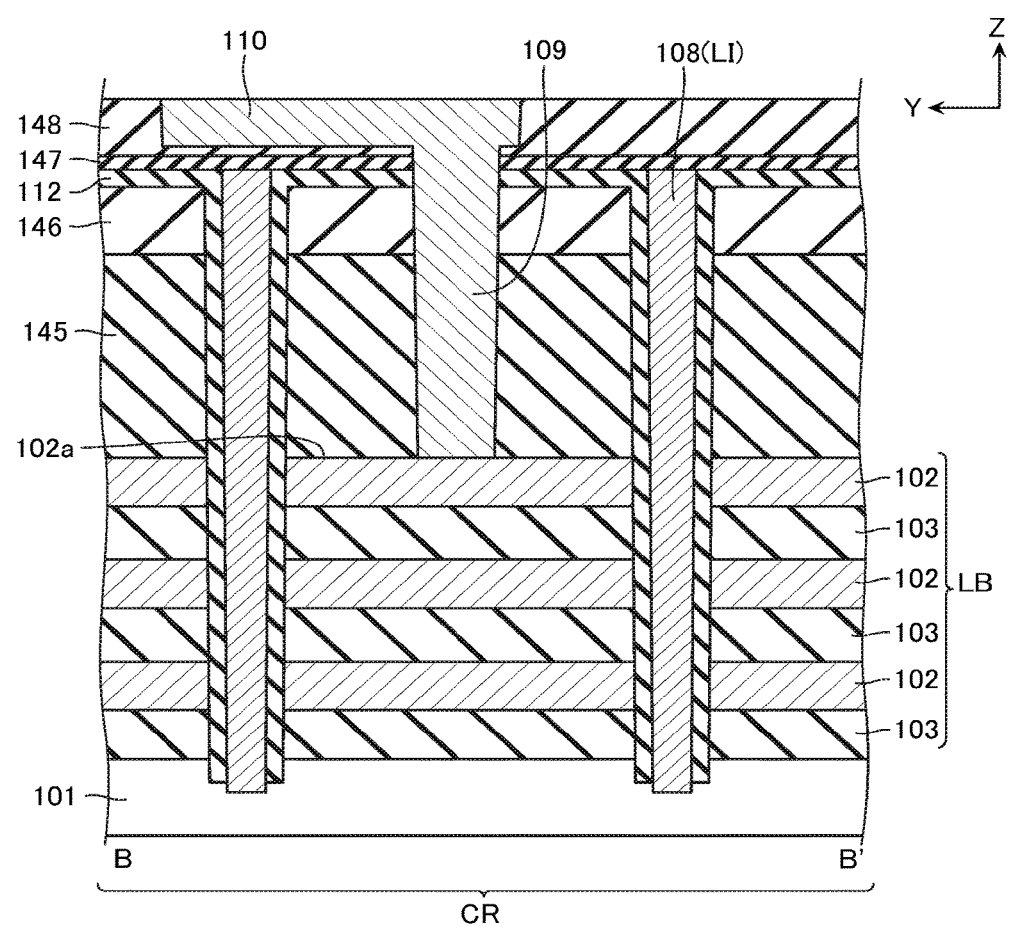

Next, as shown in FIGS. 17 and 18, planarization is performed on the conductive layer 110A, and a portion positioned on an upper surface of the insulating layer 148, of the conductive layer 110A is removed. As a result, the contact 109, the conductive layer 110, and the first conductive layer 139 are formed. Note that planarization is performed by a method such as CMP (Chemical Mechanical Polishing), for example.

Note that if, at this time, for example, the recess CC1 is not provided in the memory region MR or the conductive layer 110A gets completely removed in the memory region MR, then sometimes, dishing occurs in the memory region MR, and a height of the upper surface of the insulating layer 148 ends up being different for the memory region MR and the contact region CR. Accordingly, in the present embodiment, as described with reference to FIG. 13, the memory region MR is provided with the recess CC1 to be implanted with part of the conductive layer 110A, planarization is performed such that this part of the conductive layer 110A is not completely removed, and as a result, dishing in the memory region MR is suppressed.

Figure 19:
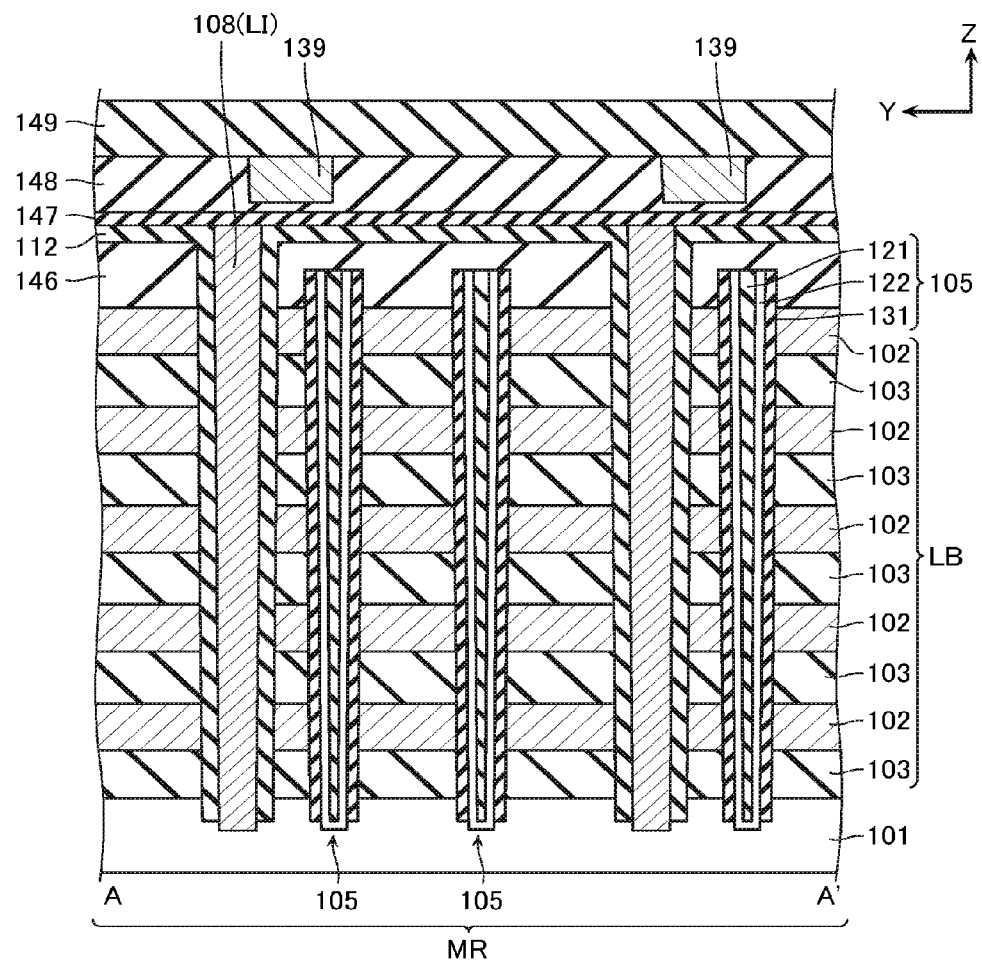
Figure 20:
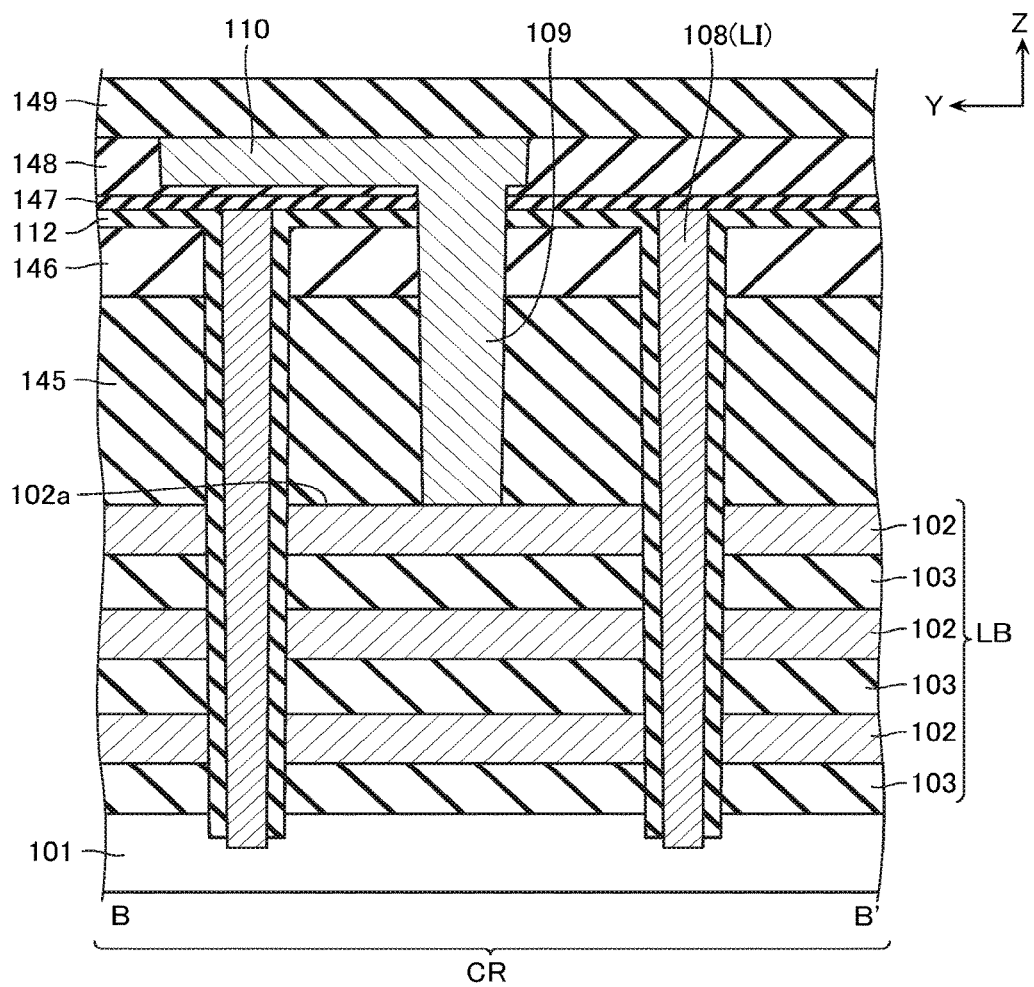

Next, as shown in FIGS. 19 and 20, the insulating layer 149 of the likes of silicon oxide ($SiO_2$) is formed on upper surfaces of the insulating layer 148, the conductive layer 110, and the first conductive layer 139. The insulating layer 149 is formed by a method such as CVD, for example.

Figure 21:
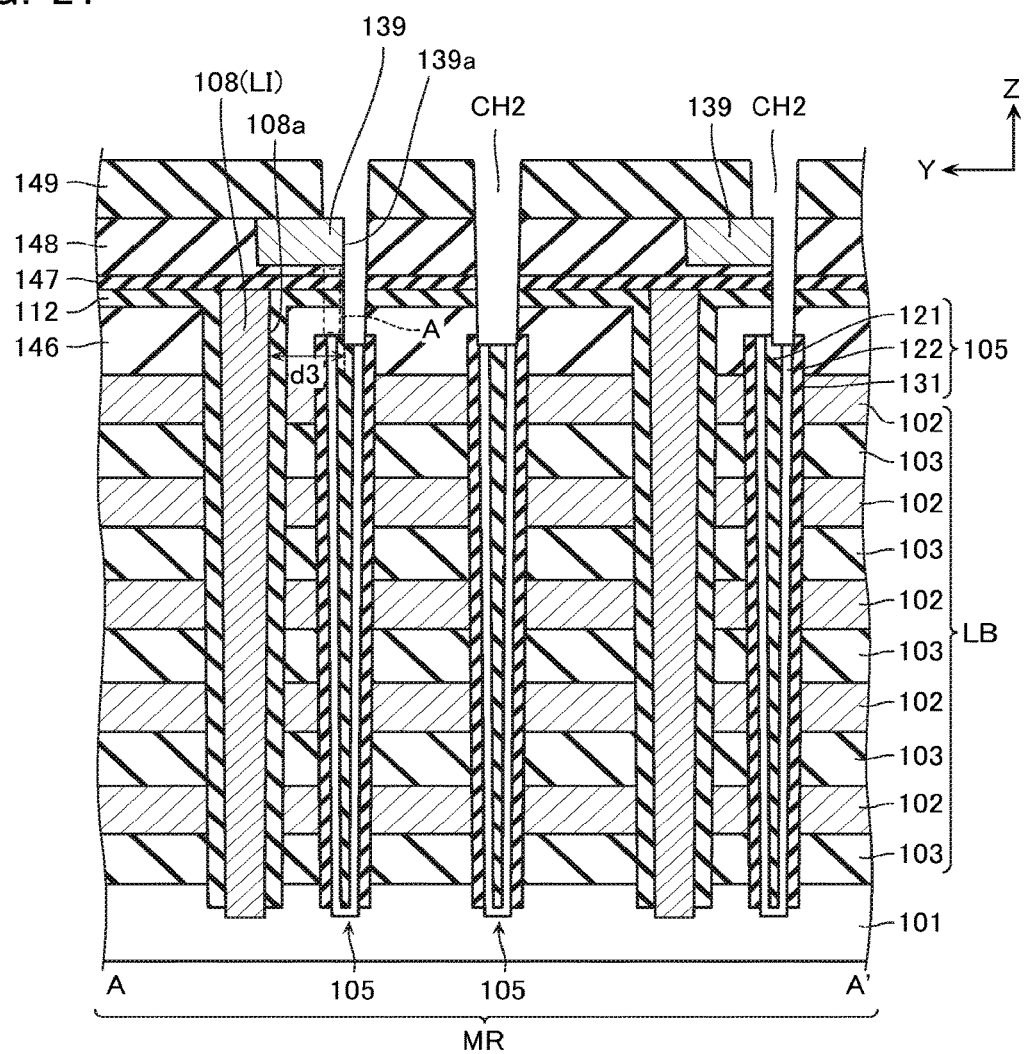
Figure 22:
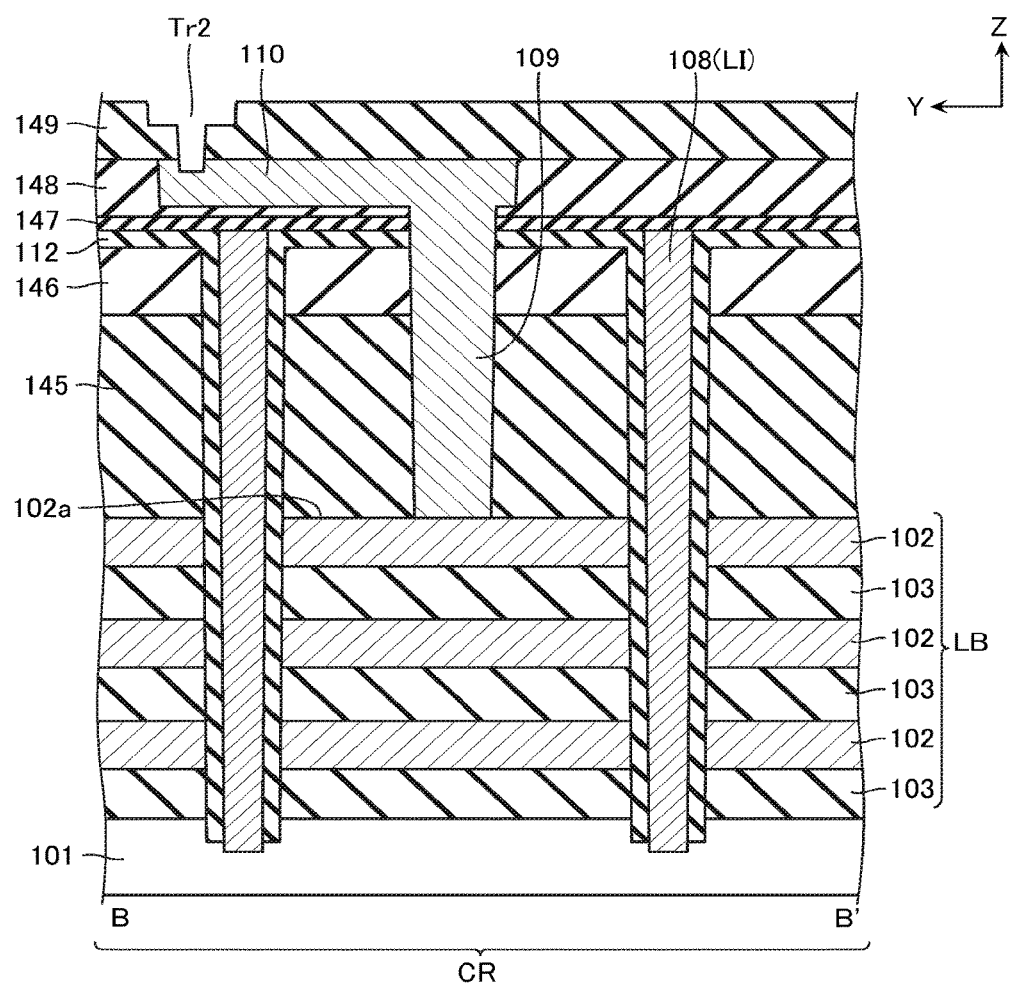

Next, as shown in FIGS. 21 and 22, a contact hole CH2 is formed in the memory region MR, and a trench Tr2 is formed in the contact region CR. As shown in FIG. 21, the contact hole CH2 is a via hole having a shape corresponding to that of the conductive layer 114 (bit line contact BC), and penetrates the insulating layer 149, the insulating layer 148, the etching stopper layer 147, the spacer insulating layer 112, and the inter-layer insulating layer 146 to expose an upper end of the first semiconductor layer 122. As shown in FIG. 22, the trench Tr2 is a trench having a shape corresponding to that of the conductive layer 113, and penetrates the insulating layer 149 to expose an upper surface of the conductive layer 110. Note that these contact hole CH2 and trench Tr2 are formed by a method such as RIE, for example.

Figure 23:
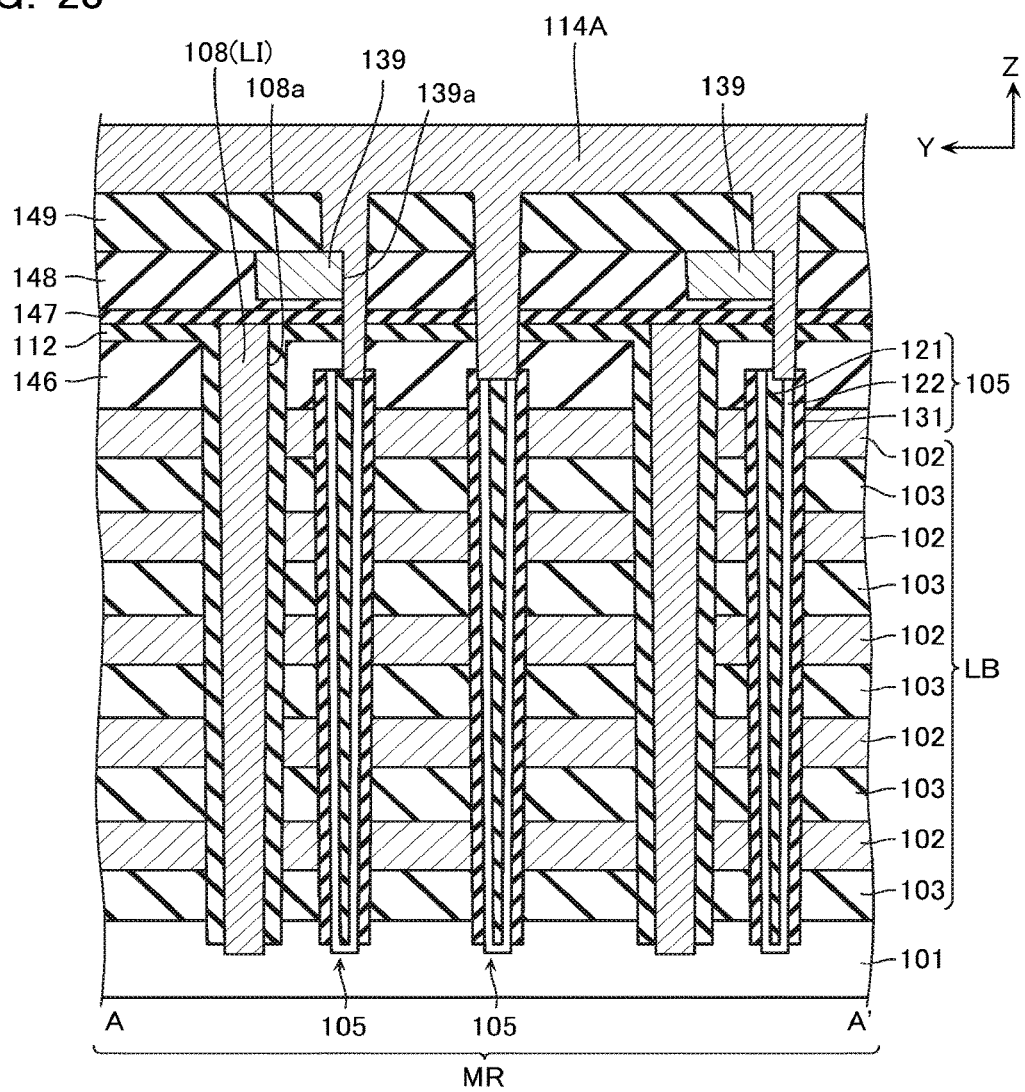
Figure 24:
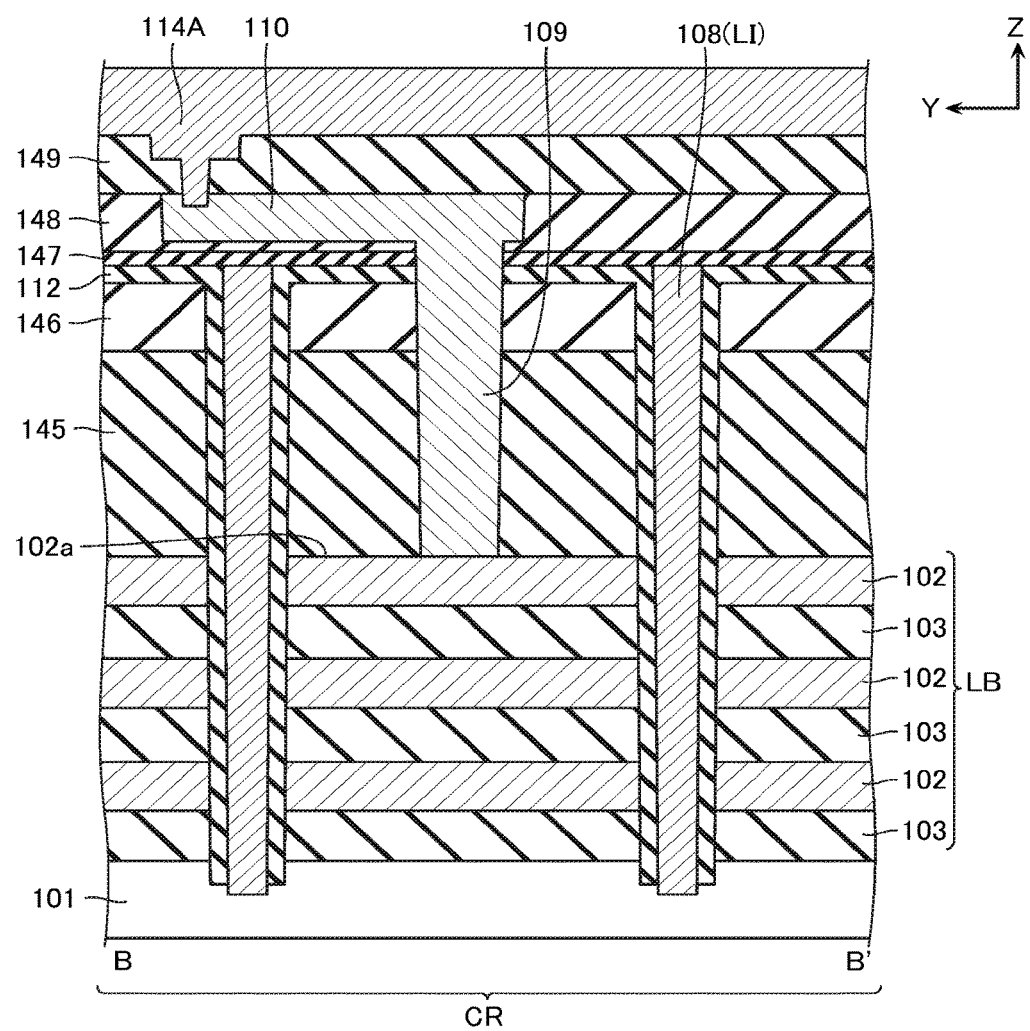

Next, as shown in FIGS. 23 and 24, a conductive layer 114A of the likes of tungsten (W) is formed so as to bury these contact hole CH2 and trench Tr2. The conductive layer 114A is formed by a method such as CVD, for example.

Subsequently, as shown in FIGS. 6 and 7, planarization by the likes of CMP is performed. As a result, an excess portion of the conductive layer 114A is removed, whereby the conductive layer 114 and the conductive layer 113 are formed. As a result, the nonvolatile semiconductor memory device of the kind described with reference to FIGS. 5 to 7 is manufactured.

Now, in the method of manufacturing according to the present embodiment, the conductive layer 114 is formed by a damascene method. That is, the contact hole CH2 is formed so as to expose the upper end of the first semiconductor layer 122 (FIG. 21), the conductive layer 114A is implanted in this contact hole CH2 (FIG. 23), and the excess portion of the conductive layer 114A is removed by planarization, whereby the conductive layer 114 of the kind described with reference to FIG. 6 is formed.

However, in such a method, sometimes, due to the likes of warping of the substrate 101 caused by thermal contraction during forming of the conductive layer 102 or conductive layer 108, for example, a position of the contact hole CH2 gets misaligned from a design value. Now, if the position of the contact hole CH2 gets misaligned in the Y direction, then sometimes, the likes of the short circuit defect of the kind described with reference to FIG. 9 ends up occurring.

Accordingly, in the present embodiment, as shown in FIG. 21, the end 139a in the Y direction of the first conductive layer 139 is formed closer to a portion where the conductive layer 114 is formed than the end 108a in the Y direction of the conductive layer 108 is. Therefore, even if the contact hole CH2 gets positioned close to the conductive layer 108, the first conductive layer 139 functions as an etching stopper, and the portion A downward of the first conductive layer 139 is not removed. Therefore, the distance d3 in the Y direction between the contact hole CH2 and the conductive layer 108 can be secured. As a result, occurrence of the likes of the short circuit defect described with reference to FIG. 9 can be suppressed.

[Amount of Superposition of First Conductive Layer 139 and Conductive Layer 114]

Figure 25:
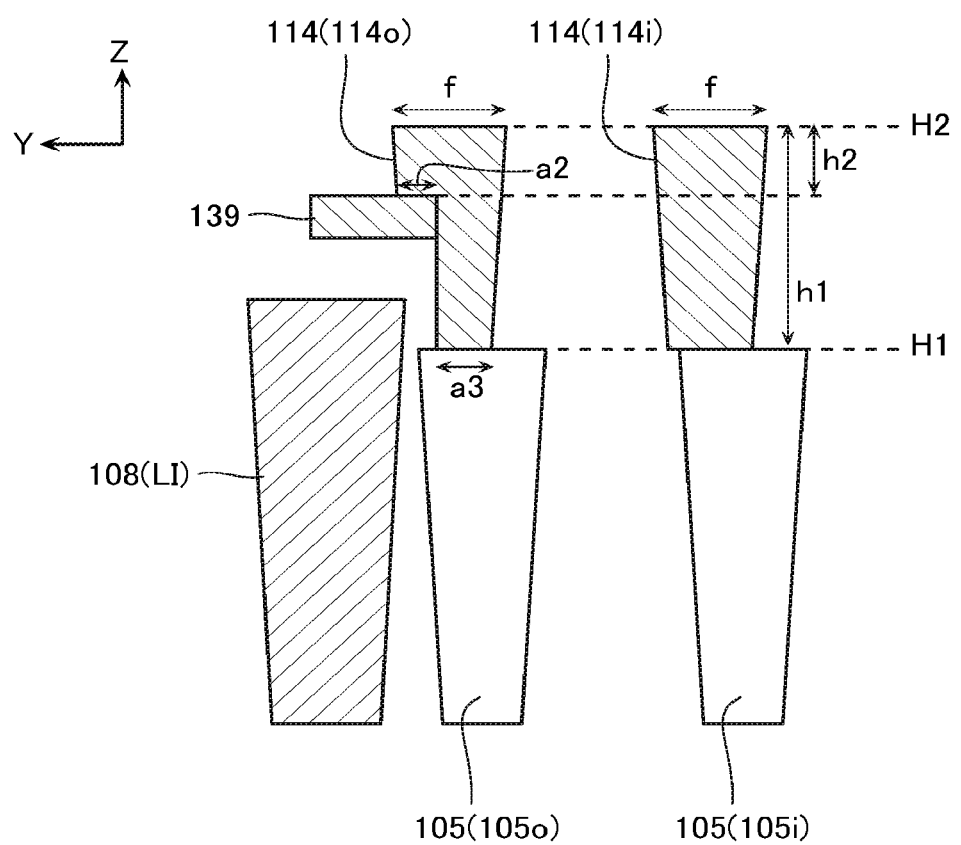
FIG. 25 is a cross-sectional view for explaining an amount of superposition of a first conductive layer 139 and a conductive layer 114.

FIG. 25 is a cross-sectional view for explaining an amount a2 of superposition in the Y direction of the first conductive layer 139 and the conductive layer 114. Note that in the description below, a height (position in the Z direction) of an upper surface of the memory columnar body 105 will be called H1, and a height (position in the Z direction) of an upper surface of the conductive layer 114 will be called H2.

The conductive layer 114 functions as the bit line contact BC, hence desirably has a low electrical resistance value. Now, the likes of a width or position of the conductive layer 114 vary due to manufacturing error and so on. In view of such points, a width a3 in the Y direction of the outer conductive layer 114o at the height H1 can be set so as to satisfy the following expression 1, for example.

$$a3 \geq \sqrt{a^2+b^2+c^2+d^2} + e \qquad \text{Expression 1}$$

a: error in positioning with respect to reference position of first conductive layer 139, b: error in positioning with respect to reference position of conductive layer 114, c: error in positioning between conductive layer 114 and memory columnar body 105, d: variation in width in Y direction of memory columnar body 105 at height H1, e: minimum value of width a3 that electrical resistance value attains desired value Now, the amount a2 of superposition in the Y direction of the first conductive layer 139 and the conductive layer 114 is desirably set such that the above-described width a3 satisfies the above-described expression 1.

Now, the above-described amount a2 of superposition can be expressed as in the following expression 2.

$$a2 = (f - a3)\frac{h2}{h1} \qquad \text{Expression 2}$$

f: width in Y direction of conductive layer 114 at height H2, h1: height (width in Z direction) of conductive layer 114, h2: width in Z direction from upper surface of conductive layer 114 to upper surface of first conductive layer 139

Therefore, by substituting expression 1 into expression 2, the above-described amount a2 of superposition can be expressed as in the following expression 3.

$$a2 \leq \left(f - \sqrt{a^2+b^2+c^2+d^2} - e\right)\frac{h2}{h1} \qquad \text{Expression 3}$$

From the above, by setting the amount a2 of superposition in the Y direction of the first conductive layer 139 and the conductive layer 114 so as to satisfy expression 3, it is possible to suppress occurrence of the likes of the short circuit defect while preferably reducing the electrical resistance value of the conductive layer 114.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a plurality of control gate electrodes stacked in a first direction above a substrate;
a first semiconductor layer that extends in the first direction and faces the plurality of control gate electrodes;
a gate insulating layer provided between the control gate electrode and the first semiconductor layer;
a first contact connected to an upper end of the first semiconductor layer;

a second semiconductor layer connected to a lower end of the first semiconductor layer and extending in a second direction intersecting the first direction;
a second contact connected to the second semiconductor layer at its lower end and extending in the first direction, an upper end of the second contact being further from the substrate than an upper surface of the second semiconductor layer; and
a first conductive layer provided above the second contact, an upper surface of the first conductive layer being nearer to the substrate than an upper end of the first contact and a lower surface of the first conductive layer being further from the substrate than a lower end of the first contact, wherein
in the second direction, an end of the first conductive layer closest to the first contact is positioned on a closer side to the first contact than an end of the second contact closest to the first contact, and
the first conductive layer and the second contact are not connected to each other.

2. The semiconductor memory device according to claim 1, wherein
the first contact comprises:
a first portion connected to the upper end of the first semiconductor layer; and
a second portion provided above the first portion, and
the first portion contacts an end of the first conductive layer from the second direction.

3. The semiconductor memory device according to claim 2, wherein the second portion contacts the upper surface of the first conductive layer from the first direction.

4. The semiconductor memory device according to claim 3, wherein a width of the first portion in the second direction is smaller than a width of the second portion in the second direction.

5. The semiconductor memory device according to claim 1, wherein
the control gate electrode and the second contact extend in a third direction intersecting the first and second directions,
pluralities of the first semiconductor layers and the first contacts are arranged at a first pitch along the third direction, and
a plurality of the first conductive layers are arranged at the first pitch along the third direction.

6. The semiconductor memory device according to claim 5, wherein the plurality of first conductive layers are divided in the third direction.

7. The semiconductor memory device according to claim 1, further comprising:
a third contact connected to the control gate electrode and extending in the first direction; and
a second conductive layer connected to an upper end of the third contact,
wherein a height of an upper surface of the second conductive layer is equal to a height of an upper surface of the first conductive layer.

8. The semiconductor memory device according to claim 1, wherein the second semiconductor layer is the substrate.

9. A semiconductor memory device, comprising:
a plurality of control gate electrodes stacked in a first direction above a substrate;
a first semiconductor layer that extends in the first direction and faces the plurality of control gate electrodes;
a gate insulating layer provided between the control gate electrode and the first semiconductor layer;
a first contact connected to an upper end of the first semiconductor layer;
a second semiconductor layer connected to a lower end of the first semiconductor layer and extending in a second direction intersecting the first direction;
a second contact connected to the second semiconductor layer at its lower end and extending in the first direction, an upper end of the second contact being further from the substrate than an upper surface of the second semiconductor layer; and
a first conductive layer provided above the second contact, an upper surface of the first conductive layer being nearer to the substrate than an upper end of the first contact and a lower surface of the first conductive layer being further from the substrate than a lower end of the first contact, wherein
the first conductive layer contacts the first contact from the second direction, and
the first conductive layer and the second contact are not connected to each other.

10. The semiconductor memory device according to claim 9, wherein
the first contact comprises:
a first portion connected to the upper end of the first semiconductor layer; and
a second portion provided above the first portion, and
the first portion contacts an end of the first conductive layer from the second direction.

11. The semiconductor memory device according to claim 10, wherein the second portion contacts the upper surface of the first conductive layer from the first direction.

12. The semiconductor memory device according to claim 11, wherein a width of the first portion in the second direction is smaller than a width of the second portion in the second direction.

13. The semiconductor memory device according to claim 9, wherein
the control gate electrode and the second contact extend in a third direction intersecting the first and second directions,
pluralities of the first semiconductor layers and the first contacts are arranged at a first pitch along the third direction, and
a plurality of the first conductive layers are arranged at the first pitch along the third direction.

14. The semiconductor memory device according to claim 13, wherein the plurality of first conductive layers are divided in the third direction.

15. The semiconductor memory device according to claim 9, further comprising:
a third contact connected to the control gate electrode and extending in the first direction; and
a second conductive layer connected to an upper end of the third contact,
wherein a height of an upper surface of the second conductive layer is equal to a height of the upper surface of the first conductive layer.

16. The semiconductor memory device according to claim 9, wherein the second semiconductor layer is the substrate.

* * * * *